United States Patent
Nakamizo et al.

(10) Patent No.: US 11,094,568 B2
(45) Date of Patent: Aug. 17, 2021

(54) PROCESSING APPARATUS, ABNORMALITY DETECTION METHOD, AND STORAGE MEDIUM

(71) Applicant: TOKYO ELECTRON LIMITED, Tokyo (JP)

(72) Inventors: Kenji Nakamizo, Koshi (JP); Satoshi Morita, Koshi (JP); Akinori Tanaka, Koshi (JP); Hiroshi Komiya, Koshi (JP); Mikio Nakashima, Koshi (JP); Kousuke Fukuda, Koshi (JP); Youichi Masaki, Koshi (JP); Ryoji Ando, Koshi (JP); Ikuo Sunaka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 333 days.

(21) Appl. No.: 15/960,800

(22) Filed: Apr. 24, 2018

(65) Prior Publication Data

US 2018/0308730 A1 Oct. 25, 2018

(30) Foreign Application Priority Data

Apr. 24, 2017 (JP) .............. JP2017-085645
Mar. 1, 2018 (JP) .............. JP2018-036149

(51) Int. Cl.
*H01L 21/67* (2006.01)
*G01F 9/00* (2006.01)
(Continued)

(52) U.S. Cl.
CPC ........ *H01L 21/67253* (2013.01); *G01F 9/001* (2013.01); *G01M 3/2876* (2013.01);
(Continued)

(58) Field of Classification Search
CPC ......... H01L 21/67253; H01L 21/67288; H01L 21/6708; G01M 3/2876; G05B 23/0235
See application file for complete search history.

(56) References Cited

U.S. PATENT DOCUMENTS

2016/0246307 A1* 8/2016 Nogami ............ H01L 21/67051

FOREIGN PATENT DOCUMENTS

| JP | 2003-218022 A | | 7/2003 |
|----|---------------|---|--------|
| JP | 2016115844 A | * | 6/2016 |

OTHER PUBLICATIONS

Machine translation: JP2016-115844A; Mochida et al. (Year: 2016).*

* cited by examiner

*Primary Examiner* — Natasha N Campbell
(74) *Attorney, Agent, or Firm* — Nath, Goldberg & Meyer; Jerald L. Meyer

(57) ABSTRACT

A processing apparatus includes a chamber configured to accommodate a substrate to be processed, a nozzle provided in the chamber and configured to supply a processing solution to the substrate, a flow rate measuring part configured to measure a flow rate of the processing solution supplied to the nozzle, a flow path opening/closing part configured to open and close a supply flow path of the processing solution to the nozzle, and a controller configured to output a close signal causing the flow path opening/closing part to perform a closing operation that closes the supply flow path. The controller is configured to detect an operation abnormality of the flow path opening/closing part based on an accumulated amount of the flow rate measured by the flow rate measuring part after outputting the close signal.

9 Claims, 19 Drawing Sheets

(51) Int. Cl.
*G01M 3/28* (2006.01)
*G01F 25/00* (2006.01)
*G05B 23/02* (2006.01)
*G01F 15/00* (2006.01)

(52) U.S. Cl.
CPC .... *H01L 21/6708* (2013.01); *H01L 21/67051* (2013.01); *H01L 21/67288* (2013.01); *G01F 15/005* (2013.01); *G01F 25/0007* (2013.01); *G05B 23/0235* (2013.01); *H01L 21/67173* (2013.01)

FIG. 4
| Closing speed of second opening/closing part | | |
|---|---|---|
| Slow | Moderate | Fast |
| 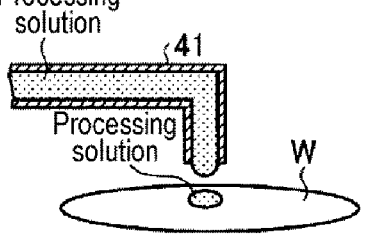 | 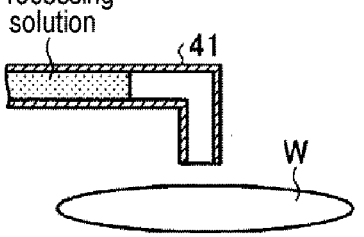 | 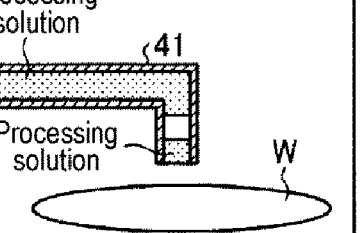 |

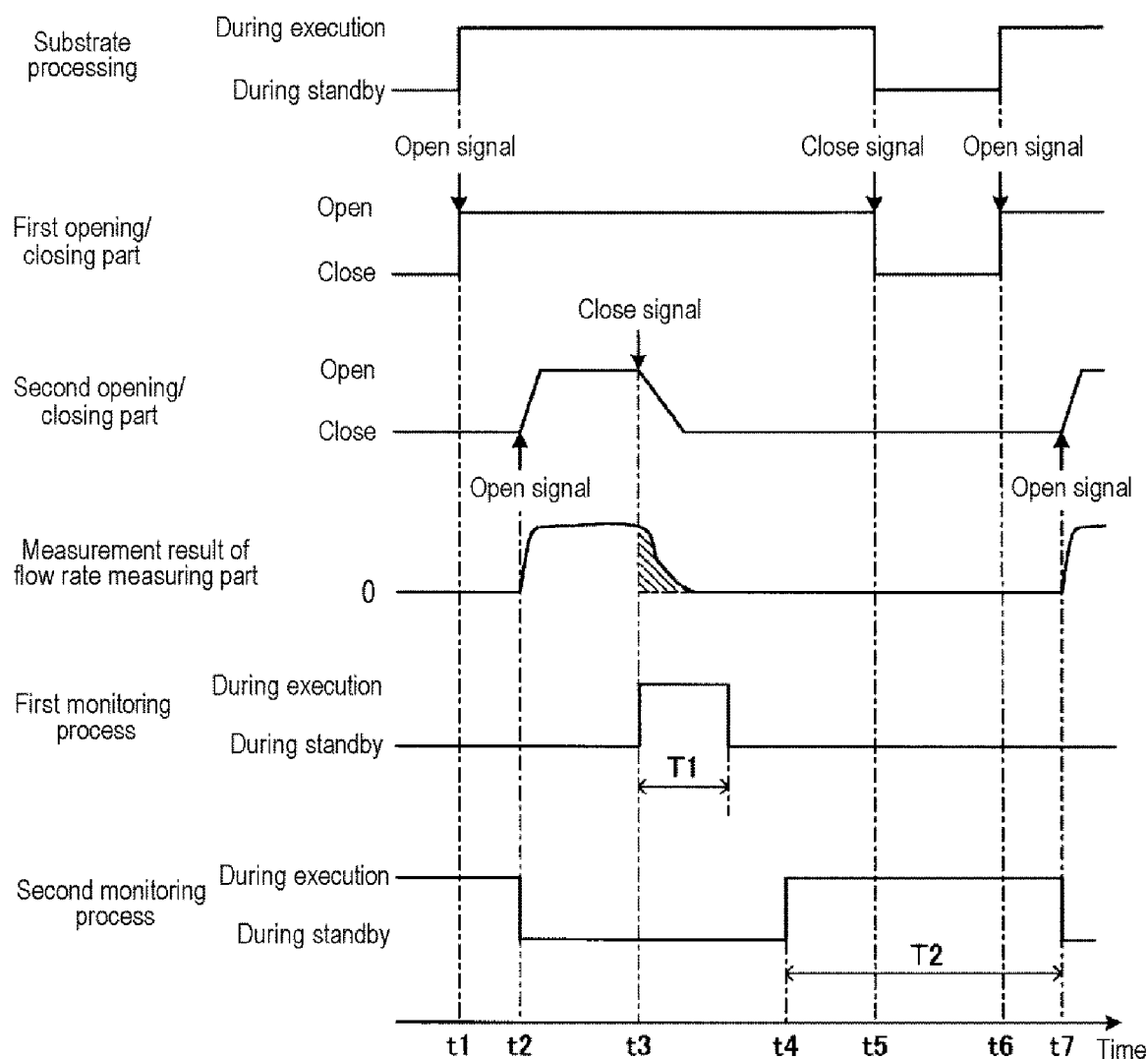

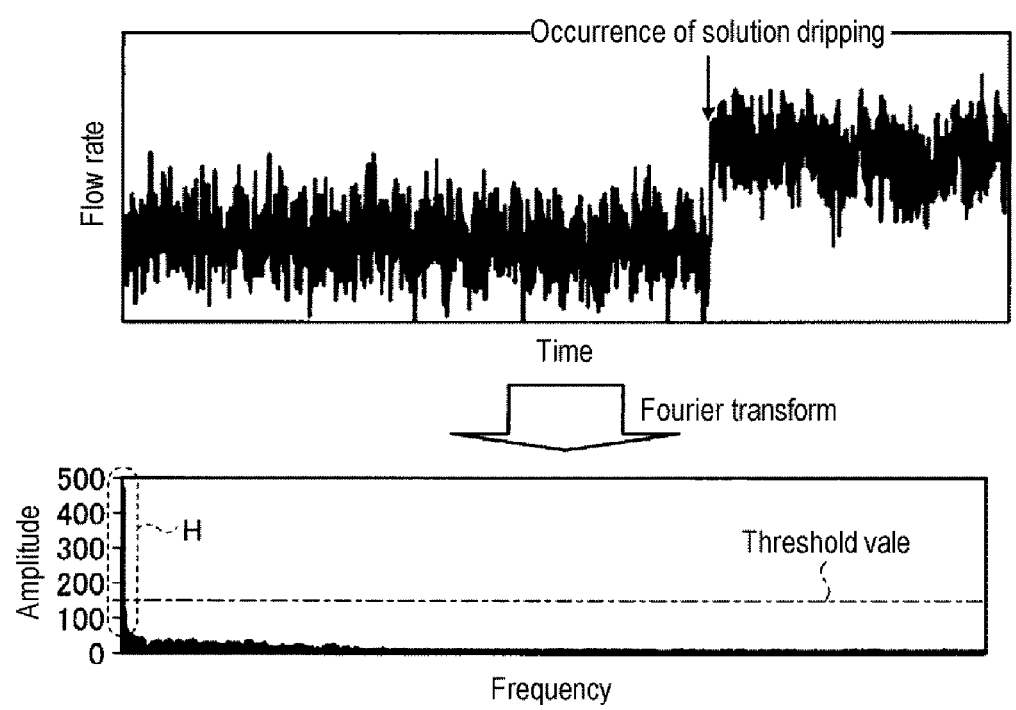

FIG. 14A
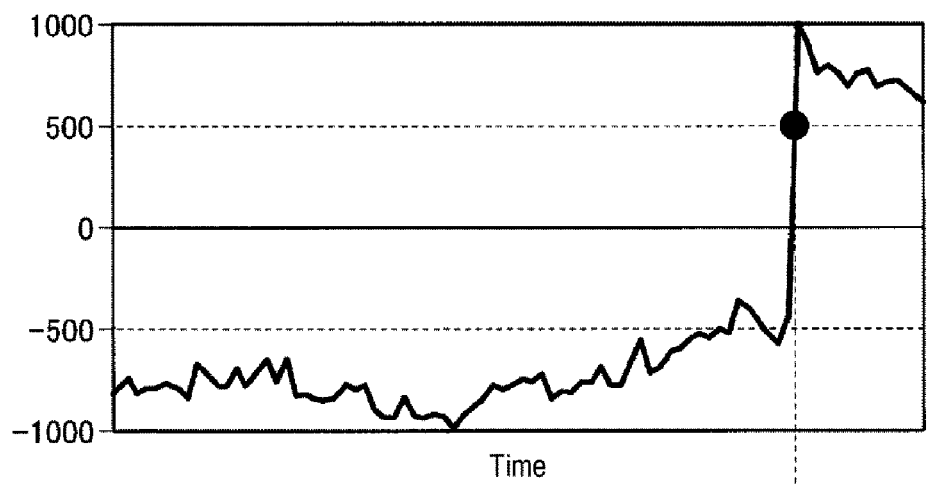
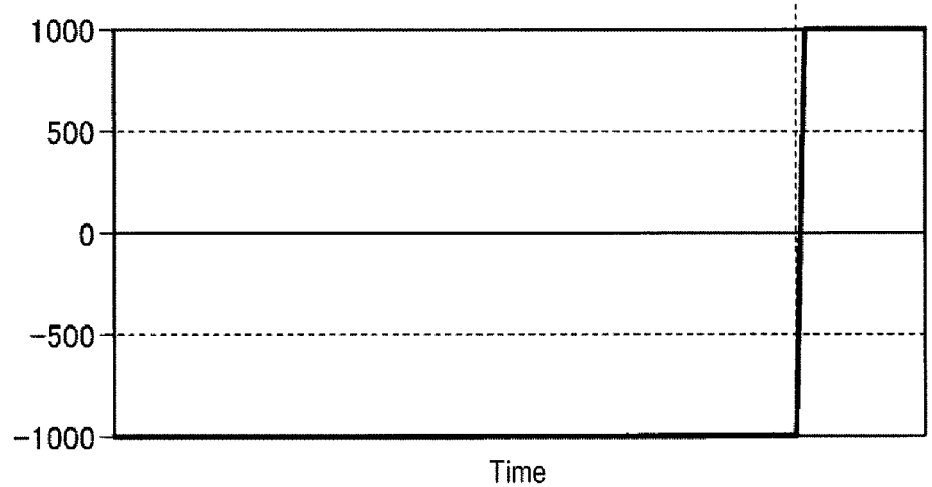

FIG. 14B
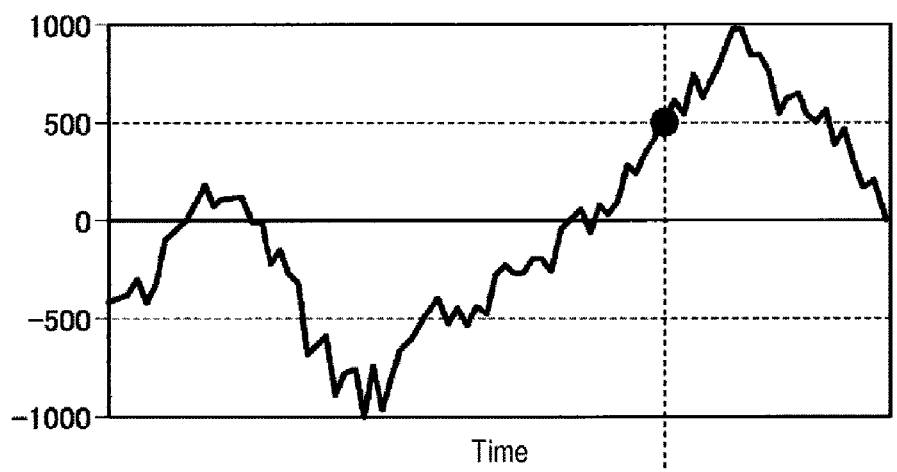
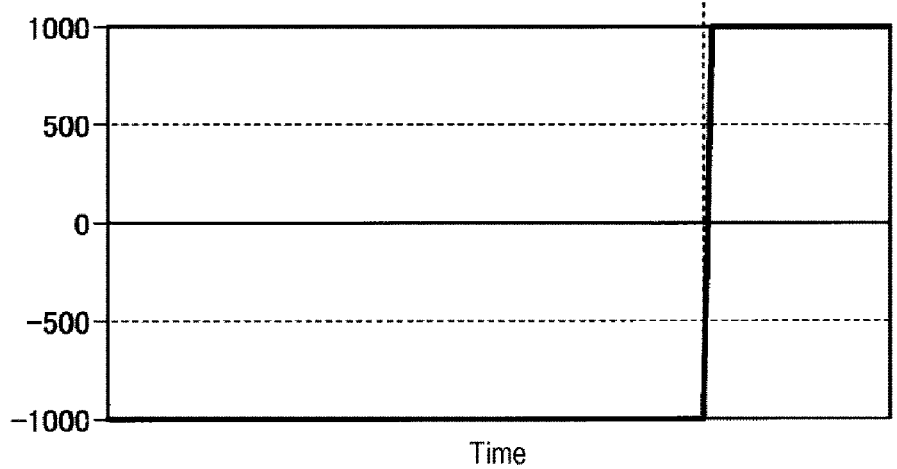

PROCESSING APPARATUS, ABNORMALITY DETECTION METHOD, AND STORAGE MEDIUM

CROSS-REFERENCE TO RELATED APPLICATIONS

This application is based upon and claims the benefit of priority from Japanese Patent Application Nos. 2017-085645 and 2018-036149, filed on Apr. 24, 2017 and Mar. 1, 2018, respectively, the entire contents of which are incorporated herein by reference.

TECHNICAL FIELD

The present disclosure relates to a processing apparatus, an abnormality detection method, and a storage medium.

BACKGROUND

As one step in a semiconductor manufacturing process, there is a solution processing step of processing a substrate by supplying a processing solution to the substrate such as a semiconductor wafer or a glass substrate.

The solution processing step is performed by disposing a nozzle connected to a processing solution supply source via a supply channel above the substrate and discharging a processing solution supplied from the processing solution supply source from the nozzle. A valve is installed in the supply channel, and the discharge state of the processing solution from the nozzle is switched by opening and closing the valve.

An air operated valve that opens and closes the valve body by a pressure of air supplied from an air supply pipe may be used as the valve installed in the supply channel. The air operated valve can adjust an opening/closing speed of the valve body by controlling a speed controller installed in the air supply pipe.

However, when a failure or foreign substance mixing occurs in the valve, there is a possibility that the processing solution leaks from the valve and thus drips from the nozzle. In addition, even when the valve itself is normal, a deviation occurs in the adjustment of the speed controller, which may cause an abnormality, e.g., the processing solution is interrupted in the supply channel.

This problem is not limited to a substrate processing apparatus but is a common problem in all processing apparatuses that process a substrate (or object) to be processed by supplying a processing solution to the substrate to be processed.

SUMMARY

The present disclosure provides some embodiments of a processing apparatus capable of detecting an abnormality in a flow path opening/closing part such as a valve or a speed controller, an abnormality detection method, and a storage medium.

According to one embodiment of the present disclosure, there is provided a processing apparatus, including: a chamber configured to accommodate a substrate to be processed; a nozzle provided in the chamber and configured to supply a processing solution to the substrate; a flow rate measuring part configured to measure a flow rate of the processing solution supplied to the nozzle; a flow path opening/closing part configured to open and close a supply flow path of the processing solution to the nozzle; and a controller configured to output a close signal causing the flow path opening/closing part to perform a closing operation that closes the supply flow path, wherein the controller is configured to detect an operation abnormality of the flow path opening/closing part based on an accumulated amount of the flow rate measured by the flow rate measuring part after outputting the close signal.

According to one embodiment of the present disclosure, there is provided a method of detecting an abnormality, including: outputting a close signal for causing a flow path opening/closing part to perform a closing operation to close a supply flow path using a processing apparatus including a chamber configured to accommodate a substrate to be processed; a nozzle installed in the chamber and configured to supply a processing solution to the substrate; a flow rate measuring part configured to measure a flow rate of the processing solution supplied to the nozzle; and the flow path opening/closing part configured to open and close the supply flow path of the processing solution to the nozzle; and detecting an operation abnormality of the flow path opening/closing part based on an accumulated amount of the flow rate measured by the flow rate measuring part after outputting the close signal.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a diagram illustrating a relationship between a speed at which a second opening/closing part is closed and a processing solution in a nozzle.

FIG. 6 is a diagram illustrating execution timings of a first monitoring process and a second monitoring process.

FIG. 7B is a diagram illustrating temporal changes in measurement results of the flow rate measuring part.

FIG. 14A is a diagram illustrating contents of a shape generation process of a comparative waveform and a comparison process between the generated shape and a leak waveform.

FIG. 14B is a diagram illustrating contents of a shape generation process of a comparative waveform and a comparison process between the generated shape and a leak waveform.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of a processing apparatus, an abnormality detection method, and a storage medium disclosed in the present application will now be described in detail with reference to the drawings. It should be noted that the present disclosure is not limited by the embodiments as described below. Further, in the following description, a case where an object to be processed is a substrate and a processing apparatus is a substrate processing system will be described as an example.

First Embodiment

First, a first embodiment of the present disclosure will be described with reference to FIGS. 1 to 9.

Figure 1:
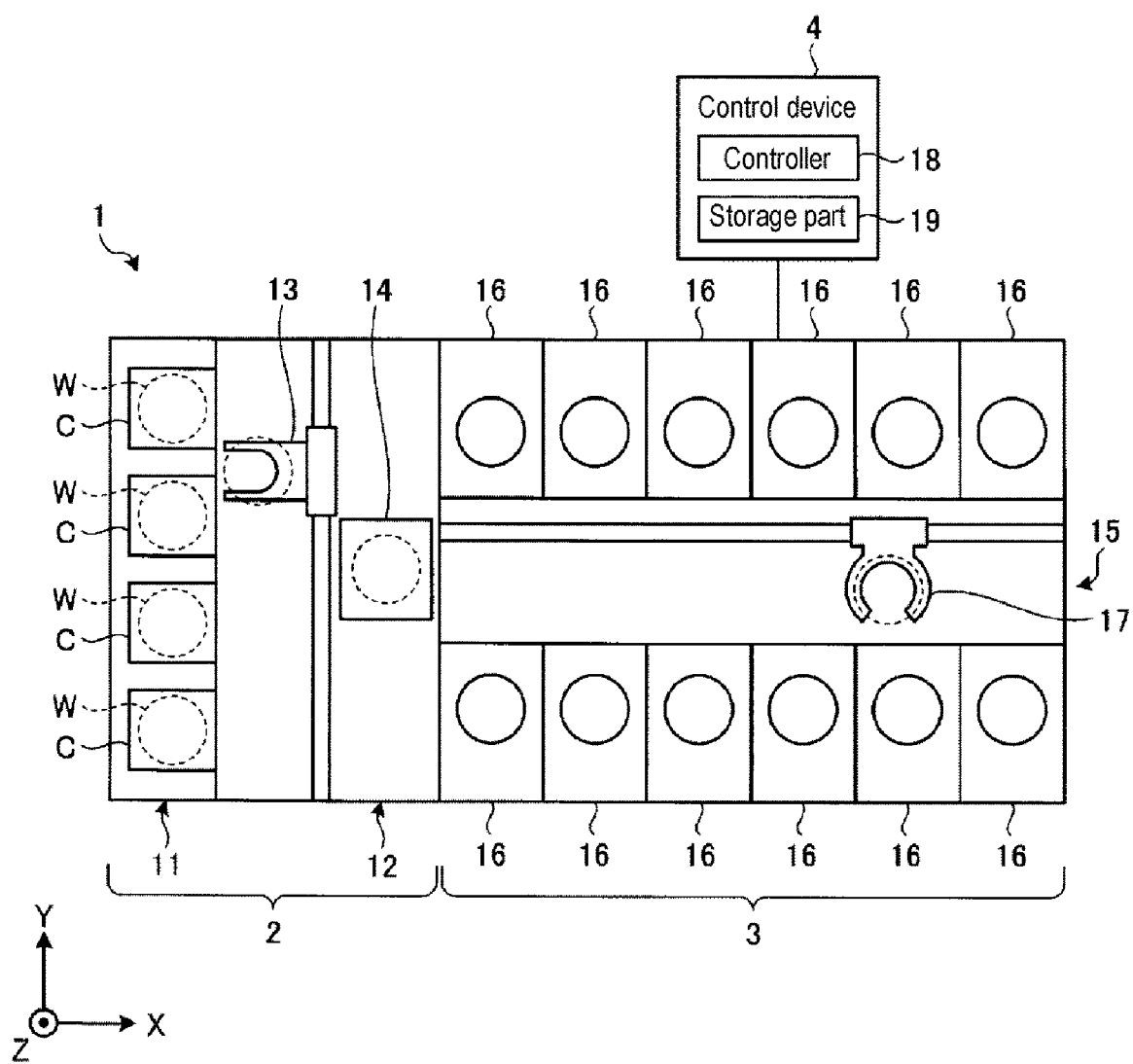
FIG. 1 is a diagram illustrating a schematic configuration of a substrate processing system according to an embodiment of the present disclosure.

FIG. 1 is a diagram illustrating a schematic configuration of a substrate processing system according to the present embodiment. In the following description, in order to clarify the positional relationship of an X axis, a Y axis and a Z axis orthogonal to each other are defined, and the Z axis positive direction is taken as a vertical upward direction.

As illustrated in FIG. 1, a substrate processing system 1 includes a loading/unloading station 2 and a processing station 3. The loading/unloading station 2 and the processing station 3 are installed adjacent to each other.

The loading/unloading station 2 includes a carrier loading part 11 and a transfer part 12. A plurality of carriers C for accommodating a plurality of substrates, in this embodiment, semiconductor wafers (hereinafter, referred to as wafers W), in a horizontal state is loaded on the carrier loading part 11.

The transfer part 12 is installed adjacent to the carrier loading part 11, and has a substrate transfer device 13 and a transfer portion 14 therein. The substrate transfer device 13 includes a wafer holding unit for holding the wafers W. Furthermore, the substrate transfer device 13 is capable of moving in the horizontal direction and in a vertical direction and rotating about a vertical axis so as to transfer the wafers W between the carriers C and the transfer portion 14 using the wafer holding unit.

The processing station 3 is installed adjacent to the transfer part 12. The processing station 3 includes a transfer part 15 and a plurality of processing units 16. The plurality of processing units 16 is installed to be arranged on both sides of the transfer part 15.

The transfer part 15 includes a substrate transfer device 17 therein. The substrate transfer device 17 includes a wafer holding unit for holding the wafers W. The substrate transfer device 17 is also capable of moving in the horizontal direction and in the vertical direction and rotating about the vertical axis so as to transfer the wafers W between the transfer portion 14 and the processing units 16 using the wafer holding unit.

The processing units 16 perform a predetermined substrate processing on the wafers W transferred by the substrate transfer device 17.

In addition, the substrate processing system 1 includes a control device 4. The control device 4 is, for example, a computer, and has a controller 18 and a storage part 19. A program for controlling various processes to be executed in the substrate processing system 1 is stored in the storage part 19. The controller 18 controls the operation of the substrate processing system 1 by reading the program stored in the storage part 19 and executing the same.

This program may also be recorded in a non-transitory computer-readable storage medium and installed in the storage part 19 of the control device 4 from the storage medium. Examples of the computer-readable storage medium include a hard disk (HD), a flexible disk (FD), a compact disc (CD), a magneto-optical disc (MO), a memory card, and the like.

In the substrate processing system 1 configured as described above, first, the substrate transfer device 13 of the loading/unloading station 2 discharges the wafers W from the carriers C loaded on the carrier loading part 11 and loads the discharged wafers W on the transfer portion 14. The wafers W loaded on the transfer portion 14 are discharged from the transfer portion 14 by the substrate transfer device 17 of the processing station 3 and carried into the processing units 16.

The wafers W carried into the processing units 16 are processed by the processing units 16, and then unloaded from the processing units 16 by the substrate transfer device 17 and loaded on the transfer portion 14. Then, the processed wafers W loaded on the transfer portion 14 are returned to the carriers C of the carrier loading part 11 by the substrate transfer device 13.

Figure 2:
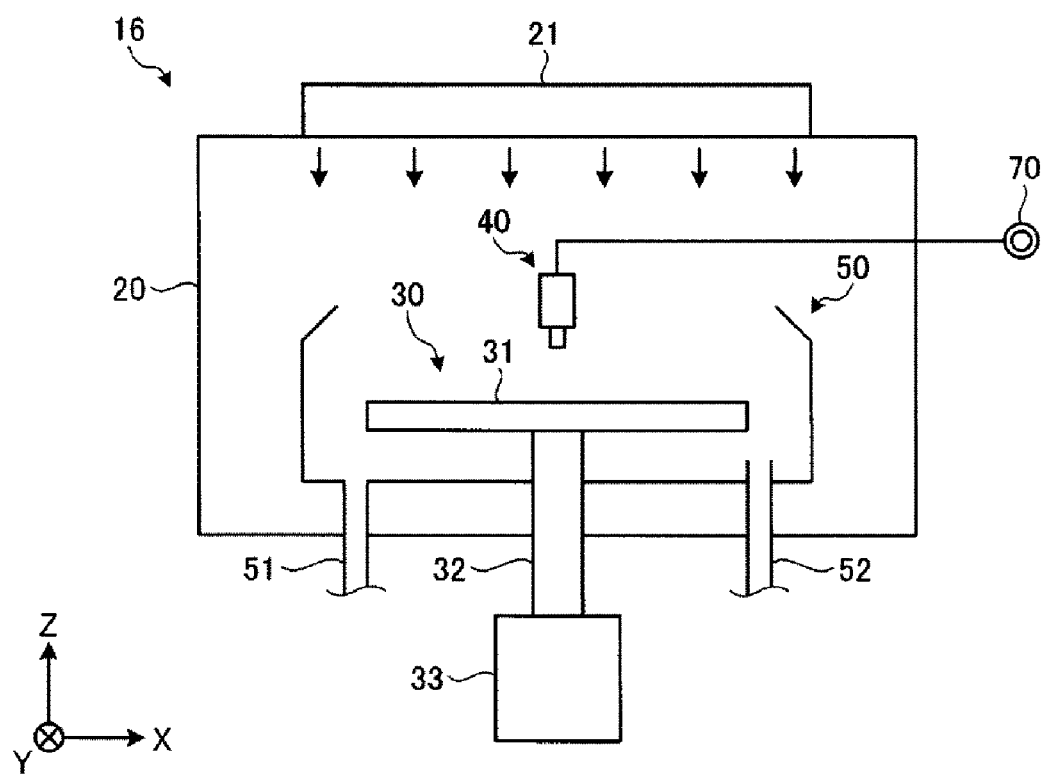
FIG. 2 is a diagram illustrating a schematic configuration of a processing unit.

Next, the processing unit 16 will be described with reference to FIG. 2. FIG. 2 is a diagram illustrating a schematic configuration of the processing unit 16.

As illustrated in FIG. 2, the processing unit 16 includes a chamber 20, a substrate holding unit 30, a processing fluid supply part 40, and a collection cup 50.

The chamber 20 accommodates the substrate holding unit 30, the processing fluid supply part 40, and the collection cup 50. A fan filter unit (FFU) 21 is installed in a ceiling portion of the chamber 20. The FFU 21 forms a down flow in the chamber 20.

The substrate holding unit 30 has a holding part 31, a pillar part 32, and a driving part 33. The holding part 31 horizontally holds the wafers W. The pillar part 32 is a member extending in the vertical direction. A base end portion thereof is rotatably supported by the driving part 33, and the holding part 31 is horizontally supported at a leading end thereof. The driving part 33 rotates the pillar part 32 about the vertical axis. The substrate holding unit 30 rotates the holding part 31 supported by the pillar part 32 by rotating the pillar part 32 using the driving part 33, thereby rotating the wafers W held by the holding part 31.

The processing fluid supply part 40 supplies a processing fluid to the wafers W. The processing fluid supply part 40 is connected to a processing solution supply source 70.

The collection cup 50 is disposed so as to surround the holding part 31, and collects a processing solution scattering from the wafers W by the rotation of the holding part 31. A liquid discharging hole 51 is formed at the bottom of the collection cup 50, and the processing solution collected by the collection cup 50 is discharged from the liquid discharging hole 51 to the outside of the processing unit 16. In addition, an exhaust hole 52 for discharging a gas supplied from the FFU 21 to the outside of the processing unit 16 is formed at the bottom of the collection cup 50.

Figure 3:
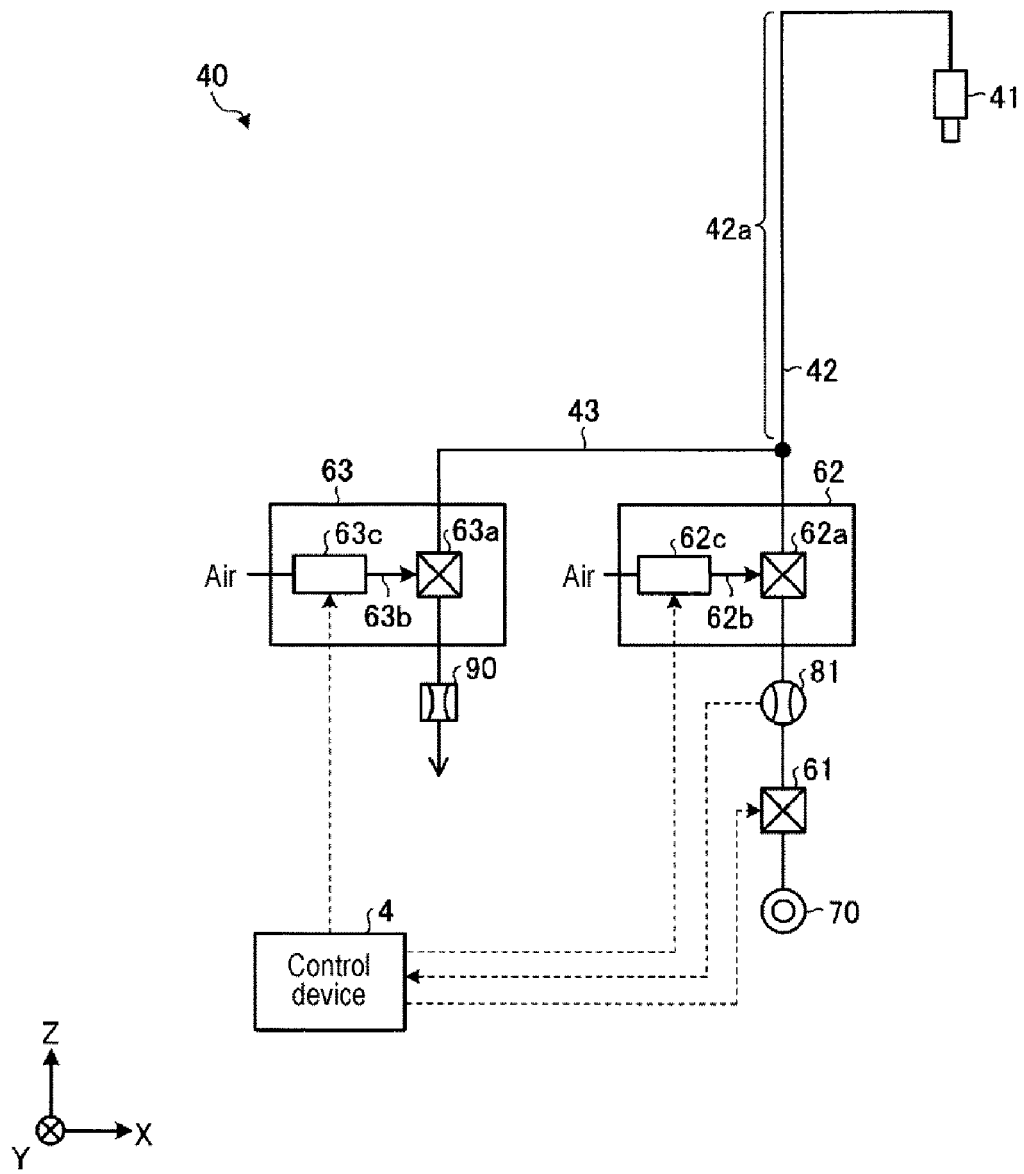
FIG. 3 is a diagram illustrating an example of a configuration of a processing fluid supply part.

Next, a configuration of the processing fluid supply part 40 included in the processing unit 16 will be described with reference to FIG. 3. FIG. 3 is a diagram illustrating an example of a configuration of the processing fluid supply part 40.

As illustrated in FIG. 3, the processing fluid supply part 40 includes a nozzle 41 that supplies a processing solution toward the wafers W, and a supply flow path 42 which connects the nozzle 41 and the processing fluid supply source 70 and supplies the processing solution from processing fluid supply source 70 to the nozzle 41. Although not illustrated in the drawing, the processing fluid supply part 40 may also include an arm for horizontally supporting the nozzle 41 and a rotary elevating mechanism for rotating and elevating the arm.

The supply flow path 42 is a tubular member and is made of a material having high chemical resistance, such as fluorine resin. A first opening/closing part 61, a flow rate measuring part 81 and a second opening/closing part 62 are installed in the supply flow path 42 sequentially from the upstream side.

The first opening/closing part 61 and the second opening/closing part 62 are an example of a flow path opening/closing part, and open and close the supply flow path 42 depending on an open signal and a close signal output from the control device 4.

The first opening/closing part 61 is, for example, an electromagnetic valve, and opens and closes the supply flow path 42 by moving the valve body using a magnetic force of a solenoid.

The second opening/closing part 62 has an air operated valve 62a, an air supply pipe 62b, and a speed controller 62c. The air operated valve 62a opens and closes the supply flow passage 42 by moving the valve body using the pressure of air supplied from the air supply pipe 62b. The speed controller 62c is provided in the air supply pipe 62b, and adjusts the flow rate of the air supplied to the air operated valve 62a. Specifically, the speed controller 62c adjusts the amount of air supplied to the air operated valve 62a, thereby controlling the air operated valve 62a to open and close at a predetermined speed.

Upon receiving the open signal from the control device 4, the speed controller 62c changes the open/close state of the air operated valve 62a from a "closed" state to an "open" state at a predetermined opening speed. Thus, the air operated valve 62a is opened at a predetermined set opening speed (set opening time). Furthermore, upon receiving the close signal from the control device 4, the speed controller 62c changes the open/close state of the air operated valve 62a from an "open" state to a "closed" state at a predetermined closing speed. Thus, the valve of the air operated valve 62a is closed at a predetermined set closing speed (set closing time).

In this manner, the second opening/closing part 62 can adjust the opening/closing speed of the supply flow path 42 by the speed controller 62c. Thus, the second opening/closing part 62 can open and close the supply flow path 42 at a slower speed than the first opening/closing part 61 which is the electromagnetic valve.

The flow rate measuring part 81 is installed between the first opening/closing part 61 and the second opening/closing part 62, and measures a flow rate of the processing solution flowing through the supply flow path 42. The measurement result of the flow rate measuring part 81 is output to the control device 4. The flow rate measuring part 81 may also be installed at the downstream side of the second opening/closing part 62.

A drain flow path 43 is connected to the supply flow path 42 at the downstream side of the second opening/closing part 62. The drain flow path 43 is a tubular member and is made of a material having high chemical resistance, such as fluorine resin. A third opening/closing part 63 and an orifice 90 are installed in the drain flow path 43.

Similar to the second opening/closing part 62, the third opening/closing part 63 has an air operated valve 63a, an air supply pipe 63b, and a speed controller 63c. The third opening/closing part 63 can adjust the opening/closing speed of the drain flow path 43 using the speed controller 63c. The orifice 90 is installed at the downstream side of the air operated valve 63a and limits the flow rate of the processing solution flowing through the drain flow path 43 by narrowing the flow path diameter of the drain flow path 43 to suppress the flow of the processing solution.

In the processing unit 16, a suck back process of retracting the solution surface position of the processing solution in the supply flow path 42 is performed in order to prevent the processing solution from dripping from the nozzle 41 after stopping the discharge of the processing solution from the nozzle 41.

Specifically, the control device 4 outputs the close signal to the second opening/closing part 62 to close the second opening/closing part 62, and then outputs the open signal to the third opening/closing part 63 to open the third opening/closing part 63. The third opening/closing part 63 may also be opened simultaneously with the closing of the second opening/closing part 62. Since the supply flow path 42 has an ascending portion 42a at the downstream side of the connection position of the drain flow path 43, when the third opening/closing part 63 is in the open state, the processing solution remaining in the supply flow path 42 is drawn into the drain flow path 43 due to its own weight and discharged from the drain flow path 43 to the outside. Thus, the solution surface position of the processing solution is retracted to prevent the processing solution from dripping from the nozzle 41.

Here, if the supply flow path 42 is closed at a rapid speed when stopping the discharge of the processing solution from the nozzle 41, there is a possibility of the occurrence of "solution interruption" in which the processing solution is cut in the middle. When the solution interruption occurs, it is impossible to retract the processing solution cut in the middle even if the suck back process is performed, making it difficult to prevent solution dripping.

Therefore, in the processing unit 16, the occurrence of solution interruption is prevented by adjusting the speed at which the air operated valve 62a is closed by the speed controller 62c.

The speed controller 62c is adjusted in advance so as to close the second opening/closing part 62 at a moderate speed. However, for example, when the conditions are changed due to long-term use, member replacement or the like, the second opening/closing part 62 is not closed at a moderate speed, which has a possibility that the solution interruption or solution dripping will occur.

A relationship between the speed (closing speed) at which the second opening/closing part 62 is closed and the processing solution in the nozzle 41 will be described with reference to FIG. 4. FIG. 4 is a diagram illustrating a relationship between the speed (closing speed) at which the second opening/closing part 62 is closed and the processing solution in the nozzle 41.

As illustrated in FIG. 4, when the closing speed of the second opening/closing part 62 is moderate, the occurrence of solution interruption of the processing solution is prevented. In addition, by preventing the occurrence of solution interruption, the solution dripping of the processing solution is also prevented by properly performing the suck back process.

On the other hand, when the closing speed of the second opening/closing part 62 is slower than the moderate speed, as illustrated in the leftmost drawing of FIG. 4, there is a possibility that dripping of the processing solution from the nozzle 41 will occur. In addition, when the closing speed of the second opening/closing part 62 is faster than the moderate speed, as illustrated in the right diagram of FIG. 4, there is a possibility that interruption of the processing solution will occur.

Furthermore, although the closing speed of the second opening/closing part 62 is moderate, when a failure, foreign substance mixing or the like occurs in the air operated valve 62a, the processing solution leaks from the air operated valve 62a, which leads to a possibility that dripping of the processing solution will occur, as illustrated in the leftmost drawing of FIG. 4.

Therefore, in the substrate processing system 1 according to the first embodiment, the presence or absence of abnormality of the second opening/closing part 62 is monitored based on the measurement result of the flow rate measuring part 81 after outputting the close signal to the second opening/closing part 62. This will be specifically described hereinbelow.

Figure 5:
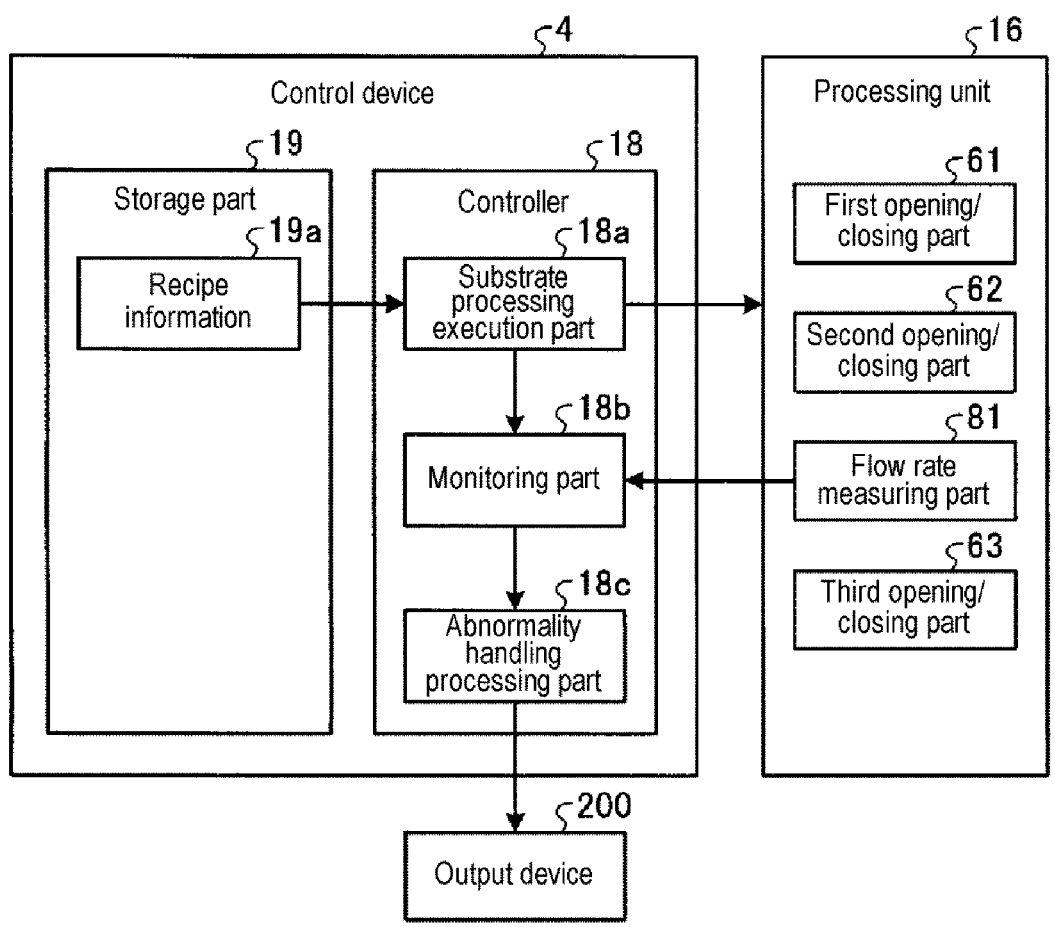
FIG. 5 is a block diagram illustrating an example of a configuration of a control device.

First, a configuration of the control device 4 will be described with reference to FIG. 5. FIG. 5 is a block diagram illustrating an example of a configuration of the control device 4. Further, in FIG. 5, the components necessary to illustrate the features of the first embodiment are represented by functional blocks, and descriptions of general components are omitted. That is, each of the components illustrated in FIG. 5 is functionally conceptual and does not necessarily need to be physically configured as illustrated. For example, the specific form of division and integration of the respective functional blocks is not limited to the one illustrated in the drawing, and all or a portion thereof may be divided and integrated functionally or physically in arbitrary units according to various loads and usage situations.

All or an arbitrary portion of the respective processing functions performed in the respective functional blocks of the control device 4 may also be realized by a processor such as a central processing unit (CPU) and a program analyzed and executed by the processor, or may be realized as hardware by wired logic.

As illustrated in FIG. 5, the control device 4 includes the controller 18 and the storage part 19 (see FIG. 1). The storage part 19 is realized by, for example, a semiconductor memory element such as a RAM or a flash memory or a storage device such as a hard disk or an optical disc. The storage part 19 stores recipe information 19a.

The recipe information 19a is information indicating the contents of substrate processing. Specifically, the recipe information 19a is information in which the contents of each processing to be executed by the processing unit 16 during the substrate processing are registered in advance in the order of processing sequences.

The controller 18 is, for example, a CPU, and functions as, for example, each of the functional blocks 18a to 18c illustrated in FIG. 5 by reading a program (not shown) stored in the storage part 19 and executing the same. The program may be recorded in a non-transitory computer-readable recording medium and installed in the storage part 19 of the control device 4 from the recording medium. Examples of the computer-readable recording medium include a hard disk (HD), a flexible disk (HD), a compact disc (CD), a magneto-optical disk (MO), a memory card, and the like.

Next, each of the functional blocks 18a to 18c will be described. The controller 18 includes a substrate processing execution part 18a, a monitoring part 18b, and an abnormality handling processing part 18c.

When the controller 18 functions as the substrate processing execution part 18a, it controls the processing unit 16 to execute a series of substrate processing based on the recipe information 19a stored in the storage part 19. For example, the controller 18 executes a series of substrate processing, including a chemical solution process of supplying a chemical solution to the wafers W, a rinsing process of supplying a rinse solution to the wafers W, and a drying process of drying the wafers W by increasing the number of revolutions of the wafers W.

The controller 18 outputs an open signal and a close signal to the first to third opening/closing parts 61 to 63 of the processing fluid supply part 40 at a timing according to the recipe information 19a such that the processing solution according to the contents of the substrate processing is discharged from the nozzle 41. At this time, the flow rate of the processing solution flowing through the supply flow path 42 is measured by the flow rate measuring part 81, and the measurement result is output to the controller 18.

When the controller 18 functions as the monitoring part 18b, it executes a "first monitoring process" and a "second monitoring process" based on the measurement result of the flow rate measuring part 81. The "first monitoring process" is a process of monitoring whether or not the adjustment of the speed controller 62c of the second opening/closing part 62 is normal. Also the "second monitoring process" is a process of monitoring the presence or absence of occurrence of dripping of the processing solution.

Here, the contents of the first monitoring process and the second monitoring process will be described with reference to FIG. 6. FIG. 6 is a diagram illustrating execution timings of the first monitoring process and the second monitoring process.

As illustrated in FIG. 6, first, the controller 18 outputs an open signal to the first opening/closing part 61 at a timing when a series of substrate processing of the wafers W starts (time t1). By doing this, the first opening/closing part 61 is opened. However, since the second opening/closing part 62 is closed, the discharge of the processing solution from the nozzle 41 is not started at the time t1.

Subsequently, the controller 18 outputs an open signal to the second opening/closing part 62 (time t2). Accordingly, the second opening/closing part 62 is opened at a predetermined set opening speed and the flow rate of the processing solution flowing through the supply flow path 42 gradually increases from zero toward a target flow rate.

Subsequently, the controller 18 outputs a close signal to the second opening/closing part 62 (time t3). Accordingly, the second opening/closing part 62 is closed at a predetermined closing speed and the flow rate of the processing solution flowing through the supply flow passage 42 gradually decreases toward zero.

The first monitoring process is executed during a first time period T1 from the time when the close signal is output to the second opening/closing part 62. The length of the first time period T1 is set to a length exceeding an expected time until the second opening/closing part 62 is fully closed so that the flow rate becomes zero from the output of the close signal. For example, the length of the first time period T1 is set to 2 seconds.

In the first monitoring process, the controller 18 monitors the presence or absence of operation abnormality of the second opening/closing part 62 based on the accumulated amount of the flow rate measured by the flow rate measuring part 81 after outputting the close signal.

That is, after the lapse of the first time period T1, the controller 18 accumulates the measurement result of the flow rate measuring part 81 during the first time period T1 and determines whether or not the accumulated amount is within a predetermined normal range. Then, when the accumulated amount is out of the normal range, the controller 18 detects an operation abnormality of the speed controller 62c.

Specifically, when the accumulated amount exceeds the normal range, the controller 18 detects dripping of the processing solution. Furthermore, when the accumulated amount is lower than the normal range, the controller 18 detects solution interruption of the processing solution in the supply flow path 42.

In the first monitoring process, the phrase "detecting dripping of the processing solution" means to detect that dripping of the processing solution has occurred or that there is a possibility that dripping of the processing solution will occur. Furthermore, the phrase "detecting solution interruption of the processing solution" means to detect that solution interruption of the processing solution has occurred or that there is a possibility that solution interruption of the processing solution will occur.

In addition, the controller 18 may determine whether there is a possibility that solution dripping or solution interruption will occur depending on an amount of deviation from the normal range of the accumulated amount, or whether the solution dripping or solution interruption actually occurs. For example, the controller 18 detects that there is a possibility of the occurrence of solution dripping or solution interruption when the amount of deviation from the normal range of the accumulated amount does not exceed a threshold value, and that the solution dripping or solution interruption actually occurs when the amount of deviation exceeds the threshold value.

Here, it is assumed that the controller 18 accumulates the flow rate measured by the flow rate measuring part 81, but the process of accumulating the flow rate may be performed by the flow rate measuring part 81. In this case, the controller 18 may obtain information on the accumulated amount from the flow rate measuring part 81.

Subsequently, after the lapse of the first time period T1, the controller 18 starts the second monitoring process (time t4).

In the second monitoring process, the controller 18 monitors the presence or absence of operation abnormality of the first opening/closing part 61 or the second opening/closing part 62 based on the flow rate measured by the flow rate measuring part 81.

Here, for example, if a minute foreign substance is mixed in the first opening/closing part 61 or the second opening/closing part 62, an amount of the processing solution leaking from the first opening/closing part 61 or the second opening/closing part 62 is very small. In this case, it is difficult to determine whether the change in the flow rate is due to a leak or due to noise from the first opening/closing part 61 or the second opening/closing part 62 by simply monitoring the measurement result of the flow rate measuring part 81.

Therefore, it is assumed that the controller 18 monitors the presence or absence of operation abnormality of the first opening/closing part 61 or the second opening/closing part 62 based on a value obtained by fast Fourier transform (FFT) of the flow rate measured by the flow rate measuring part 81.

Figure 7A:
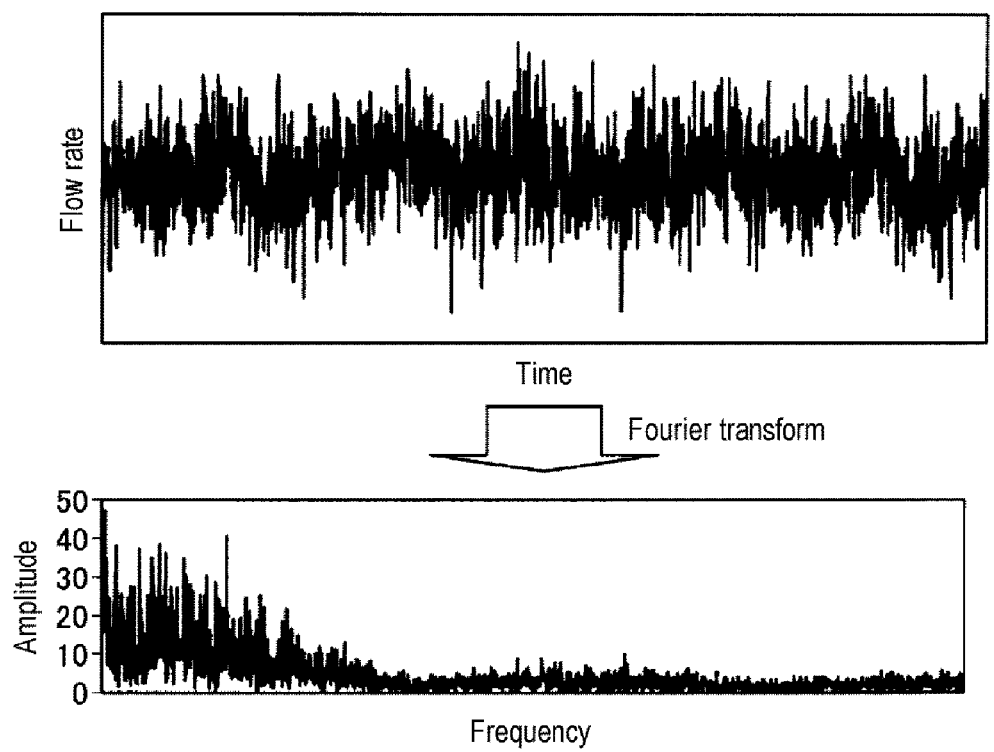
FIG. 7A is a diagram illustrating temporal changes in measurement results of a flow rate measuring part.

This will be described with reference to FIGS. 7A and 7B. FIG. 7A is a diagram illustrating actual data of the measurement result of the flow rate measuring part 81 and data after FFT when dripping of the processing solution does not occur. Furthermore, FIG. 7B is a diagram illustrating actual data of the measurement result of the flow rate measuring part 81 and data after FFT when dripping of the processing solution occurs.

As illustrated in the upper diagram of FIG. 7A, even when dripping of the processing solution does not occur, namely even when the processing solution is almost stationary in the supply flow path 42, a change in the flow rate is observed in the measurement result of the flow rate measuring part 81. This change in the flow rate is caused by noise involved in the measurement result of the flow rate measuring part 81.

Furthermore, as illustrated in the upper diagram of FIG. 7B, when the solution dripping occurs, a large change in the flow rate is observed in the measurement result of the flow rate measuring part 81, compared with a case where no solution dripping occurs. However, since the measurement result also includes noise, it is difficult to detect occurrence of solution dripping with high precision.

On the other hand, according to the data after FFT illustrated in the lower diagrams of FIGS. 7A and 7B, it can be seen that when the solution dripping occurs, the maximum value of amplitude greatly changes, compared with the case where no solution dripping occurs (see H of FIG. 7B). For example, in the examples illustrated in FIGS. 7A and 7B, the maximum value of the amplitude of the data after FFT in the case where the solution dripping occurs is about 10 times larger than in the case where no solution dripping occurs.

Therefore, the controller 18 performs fast Fourier transform on the measurement result of the flow rate measuring part 81, compares the value (maximum value) after the fast Fourier transform with a predetermined threshold value, and detects occurrence of the solution dripping when it exceeds the threshold value.

By performing the fast Fourier transform on the measurement result of the flow rate measuring part 81 in this way, it is possible to recognize the change point of the flow rate when the solution dripping occurs, and to detect the occurrence of solution dripping with high precision.

It has been described so far that the fast Fourier transform is performed, but a normal Fourier transform (FT) may be performed.

As illustrated in FIG. 6, the second monitoring process is executed after the completion of the first monitoring process, i.e., after the lapse of the first time period T1. The first time period T1 includes a time period during which the flow rate of the processing solution in the supply flow path 42 gradually decreases, i.e., a time period during which the flow rate changes. Therefore, by setting a second time period T2 excluding the first time period T1 to a monitoring time period by the second monitoring process, it is possible to prevent erroneous detection of a change in flow rate by the second opening/closing part 62 as a change in flow rate caused by solution dripping.

In addition, the second time period T2 is set to a time period after the first time period T1 and a predetermined time period lapses. By setting the time periods in this way, it is possible to more reliably prevent erroneous detection of a change in flow rate by the second opening/closing part 62 as a change in flow rate caused by solution dripping.

In the second monitoring process, the substrate processing of a next wafer W is started and continued until an open signal is again output to the second opening/closing part 62. In other words, the second time period T2 is set to a time period from a time (time t4) after the first time period T1 and a predetermined time period lapses to a time (time t7) when the open signal is again output to the second opening/closing part 62.

On the other hand, leaking of the processing solution from the first opening/closing part 61 or the air operated valve 62a may be considered as a cause of solution dripping. In the second monitoring process, when it is detected that solution dripping occurs, the controller 18 may specify in which of the first opening/closing part 61 and the air operated valve 62a leaking of the processing solution that is the cause of solution dripping occurs.

For example, during the time period from the time t4 to the time t5, the first opening/closing part 61 is opened and the air operated valve 62a is closed. Thus, during this time period, when dripping of the solution is detected, the controller 18 can detect leakage of the processing solution from the air operated valve 62a.

On the other hand, during the time period from the time t5 to the time t6, both the first opening/closing part 61 and the air operated valve 62a are closed. Thus, when dripping of the solution is not detected during the time period from the time t4 to the time t5 and dripping of the solution is detected during the time period from the time t5 to the time t6, the controller 18 can detect occurrence of leakage of the processing solution from the first opening/closing part 61.

Returning to FIG. 5, the abnormality handling processing part 18c will be described. When an abnormality is detected in the first monitoring process or the second monitoring process, the controller 18 functions as the abnormality handling processing part 18c, and executes a predetermined abnormality handling process.

For example, the controller 18 causes an output device 200 such as a display part or an audio output part to output warning information such as a warning screen or warning sound. This makes it possible for an operator to recognize that an abnormality has occurred. The controller 18 may also change the contents of the warning information to be output by the output device 200 depending on the contents of the abnormality detected in the first monitoring process or the second monitoring process.

Furthermore, the controller 18 terminates the substrate processing that is being currently executed. Thus, for example, when dripping of the processing solution occurs in next substrate processing or the like, it is possible to prevent occurrence of defective products due to adhesion of the leaked processing solution to the wafers W.

Figure 8:
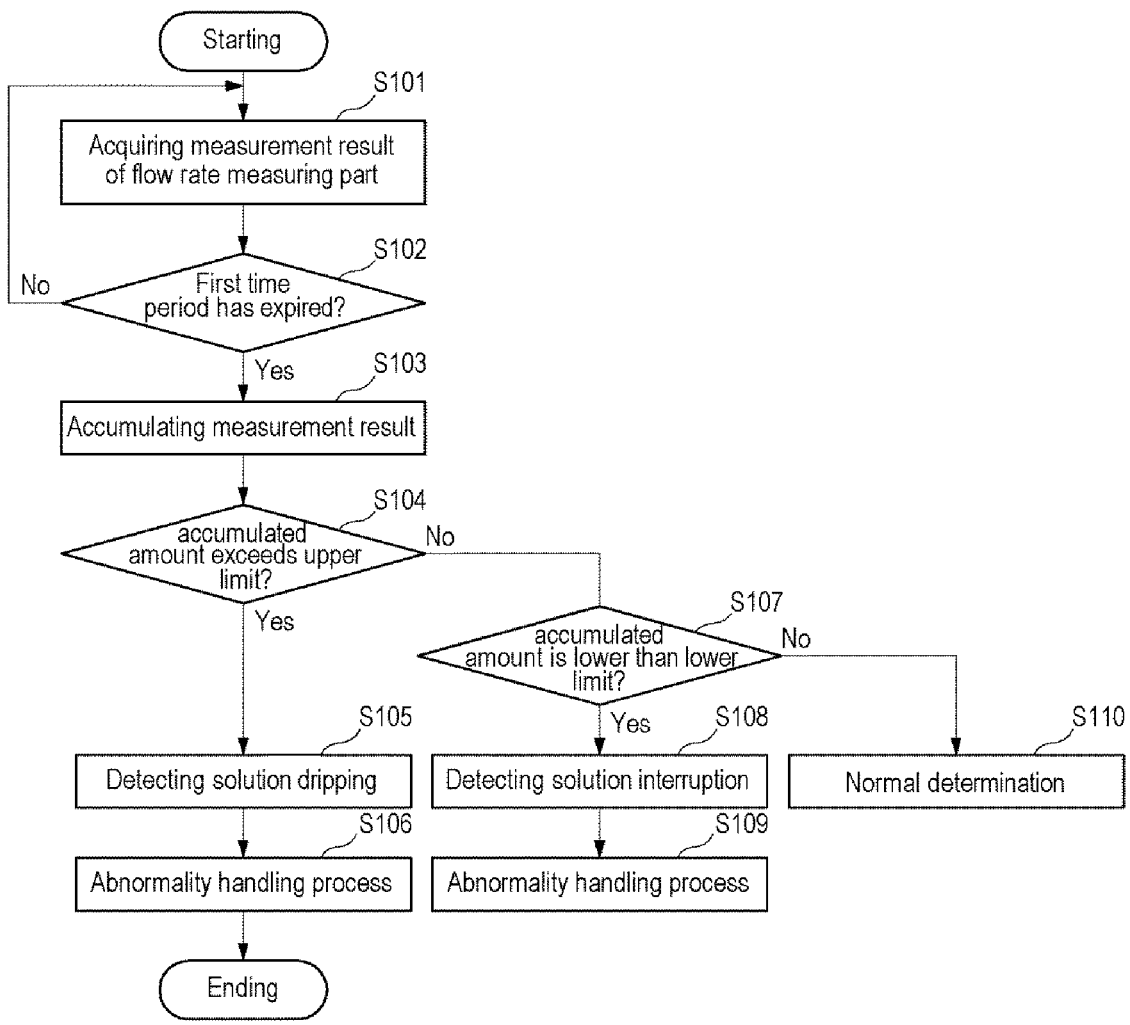
FIG. 8 is a flowchart illustrating a procedure of the first monitoring process.
Figure 9:
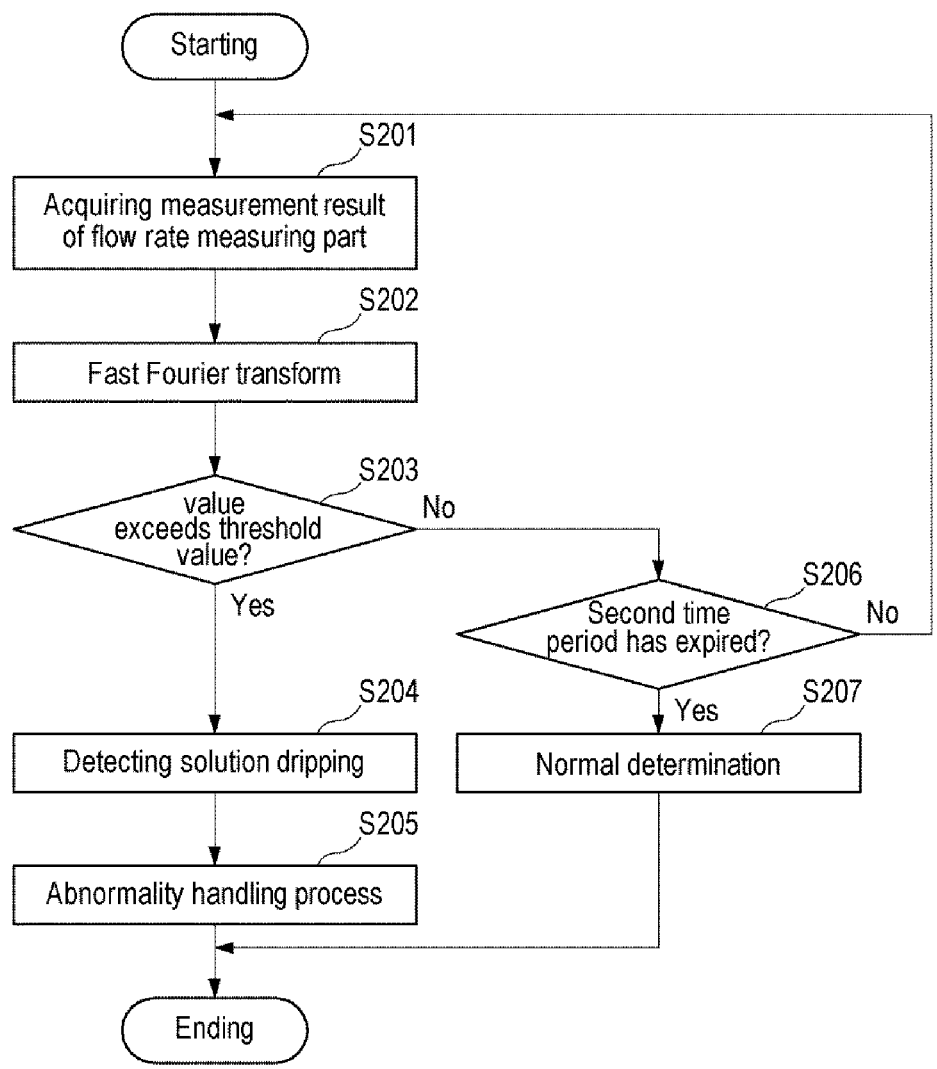
FIG. 9 is a flowchart illustrating a procedure of the second monitoring process.

Next, procedures of the first monitoring process and the second monitoring process described above will be described with reference to FIGS. 8 and 9. FIG. 8 is a flowchart illustrating a procedure of the first monitoring process, and FIG. 9 is a flowchart illustrating a procedure of the second monitoring process.

First, the procedure of the first monitoring process will be described with reference to FIG. 8. As illustrated in FIG. 8, when the first time period T1 (see FIG. 6) is started, the controller 18 acquires a measurement result of the flow rate measuring part 81 (step S101), and stores the acquired measurement result in the storage part 19. Subsequently, the controller 18 determines whether the first time period T1 has expired (step S102). When the first time period T1 has not expired ("No" at step S102), the controller 18 repeats the processing of step S101 until the first time period T1 expires. On the other hand, when the first time period T1 has expired ("Yes" at step S102), the controller 18 accumulates the measurement result acquired at step S101 (step S103).

Subsequently, the controller 18 determines whether or not the accumulated amount of the measurement result exceeds an upper limit value of the normal range (step S104). At this step, when it is determined that the accumulated amount exceeds the upper limit value of the normal range ("Yes" at step S104), the controller 18 detects solution dripping (step S105) and executes an abnormality handling process (step S106). For example, the controller 18 terminates the substrate processing and outputs warning information to the output device 200.

On the other hand, when the accumulated amount does not exceed the upper limit value of the normal range at step S104 ("No" at step S104), the controller 18 determines whether or not the accumulated amount is lower than a lower limit value of the normal range (step S107). At this step, when it is determined that the accumulated amount is lower than the lower limit value of the normal range ("Yes" at step S107), the controller 18 detects solution interruption (step S108) and executes the abnormality handling process (step S109). For example, the controller 18 terminates the substrate processing and outputs warning information to the output device 200.

When it is determined at step S107 that the accumulated amount is not lower than the lower limit value of the normal range ("No" at step S107), it is determined to be normal, indicating that there is no abnormality in the processing fluid supply part 40 (step S110). Upon completion of the processing of step S106, step S109 or step S110, the controller 18 completes the first monitoring process.

Subsequently, the procedure of the second monitoring process will be described with reference to FIG. 9. As illustrated in FIG. 9, when the second time period T2 (see FIG. 6) is started, the controller 18 acquires a measurement result of the flow rate measuring part 81 (step S201), and performs fast Fourier transform on the acquired measurement result (step S202).

Subsequently, the controller 18 determines whether the value after the fast Fourier transform exceeds a predetermined threshold value (step S203). At this step, when it is determined that the value after the fast Fourier transform exceeds the predetermined threshold value ("Yes" at step S203), the controller 18 detects solution dripping (step S204), and executes an abnormality handling process (step S205). For example, the controller 18 terminates the substrate processing and outputs warning information to the output device 200.

When the value after the fast Fourier transform does not exceed the threshold value at step S203 ("No" at step S203), the controller 18 determines whether or not the second time period T2 has expired (step S206). Then, when the second time period T2 has not expired ("No" at step S206), the controller 18 returns the processing to step S201 to repeat the processing of steps S201 to S203 and step S206.

On the other hand, when it is determined at step S206 that the second time period T2 has expired ("Yes" at step S206), the controller 18 makes a normal determination indicating that there is no abnormality in the processing fluid supply part 40 (step S207). Upon completion of the processing of step S205 or step S207, the controller 18 completes the second monitoring process.

As described above, the substrate processing system 1 (which is an example of the processing apparatus) according to the first embodiment includes the chamber 20, the nozzle 41, the flow rate measuring part 81, the second opening/closing part 62 (which is an example of the flow path opening/closing part), and the controller 18. The chamber 20 accommodates the wafers W (which are an example of the substrates to be processed). The nozzle 41 is installed in the chamber 20, and supplies the processing solution toward the wafers W. The flow rate measuring part 81 measures a flow rate of the processing solution supplied to the nozzle 41. The second opening/closing part 62 opens and closes the supply flow path 42 through which the processing solution is supplied to the nozzle 41. The controller 18 outputs the close signal for causing the second opening/closing part 62 to perform a closing operation to close the supply flow path 42. Furthermore, the controller 18 detects an operation abnormality of the second opening/closing part 62 based on the accumulated amount of the flow rate measured by the flow rate measuring part 81 after outputting the close signal.

Thus, according to the substrate processing system 1 of the first embodiment, it is possible to detect an abnormality in the second opening/closing part 62.

Second Embodiment

Figure 10:
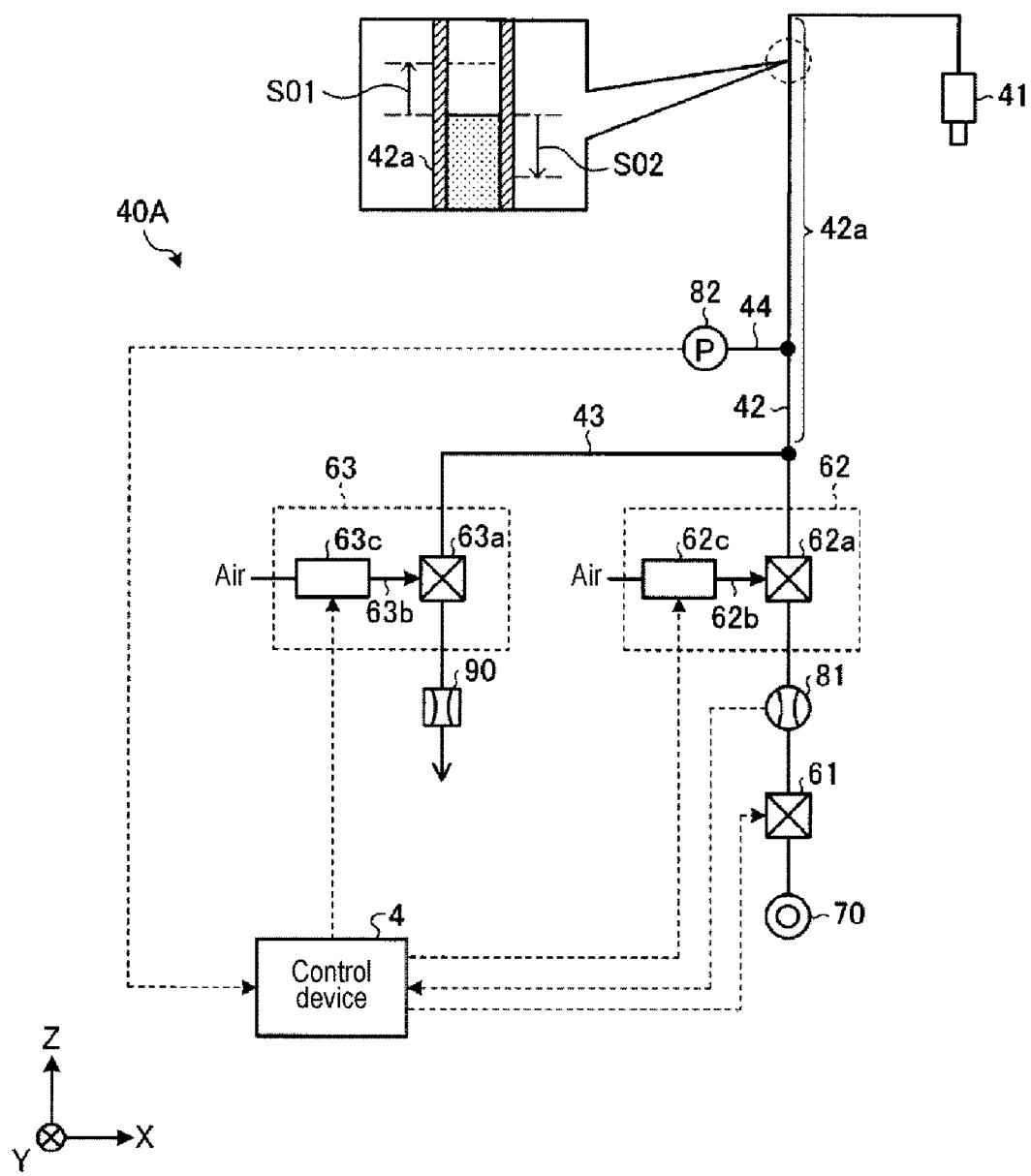
FIG. 10 is a diagram illustrating an example of a configuration of a processing fluid supply part according to a second embodiment of the present disclosure.

Next, a configuration of a processing fluid supply part according to a second embodiment of the present disclosure will be described with reference to FIG. 10. FIG. 10 is a diagram illustrating an example of a configuration of a processing fluid supply part according to a second embodiment of the present disclosure. Further, in the following description, the same parts as those already described are given the same reference numerals as those already described, and a repeated description thereof will be omitted.

As illustrated in FIG. 10, a processing fluid supply part 40A according to the second embodiment further includes a pressure measuring part 82. The pressure measuring part 82 is installed in an ascending portion 42a of the supply flow path 42 at the downstream side of the second opening/closing part 62 via a branch path 44, and measures a head pressure of a processing solution in the ascending portion 42a. The measurement result of the pressure measuring part 82 is output to the control device 4.

When the controller 18 of the control device 4 functions as the monitoring part 18b, during the second time period T2 (see FIG. 6) described above, it detects an operation abnormality of the first to third opening/closing parts 61 to 63 based on a change amount of the head pressure measured by the pressure measuring part 82.

When a leak occurs in the first opening/closing part 61 or the second opening/closing part 62, since the processing solution flows into the ascending portion 42a, the solution surface position of the processing solution rises (see S01 in FIG. 10) and the head pressure of the processing solution increases. The controller 18 can detect an operation abnormality of the first opening/closing part 61 or the second opening/closing part 62 based on the increase in the head pressure. Specifically, the controller 18 detects a leak of the processing solution from the first opening/closing part 61 or the second opening/closing part 62 when the increased amount of the head pressure in the second time period T2 exceeds a threshold value.

On the other hand, when a leak occurs in the third opening/closing part 63, since the processing solution in the ascending portion 42a flows out of the drain flow path 43, the solution surface position of the processing solution descends (see S02 in FIG. 10) and the head pressure of the processing solution decreases. The controller 18 can detect an operation abnormality of the third opening/closing part 63 based on the decrease in the head pressure. Specifically, the controller 18 detects a leak of the processing solution from the third opening/closing part 63 when the decreased amount of the head pressure in the second time period T2 exceeds a threshold value.

As described above, the substrate processing system 1 according to the second embodiment includes the pressure measuring part 82. The pressure measuring part 82 is installed in the ascending portion 42a in which the processing solution rises up in the supply flow channel 42 at the downstream side of the second opening/closing part 62, and measures the head pressure of the processing solution in the ascending portion 42a. Then, the controller 18 detects an operation abnormality of the first to third opening/closing parts 61 to 63 based on the change amount of the head pressure measured by the pressure measuring part 82 after outputting the close signal to the second opening/closing part 62.

The abnormality detection that is based on a change in the head pressure is to detect the presence or absence of abnormality depending on the accumulated amount of leaked processing solution. Thus, it is possible to detect the occurrence of a minute leak which is difficult to detect in the aforementioned second monitoring process.

Figure 11A:
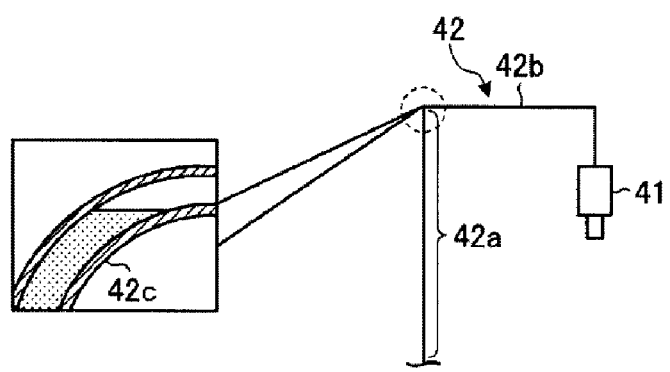
FIG. 11A is a diagram illustrating an exemplary modification of a solution surface position after a suck back process.
Figure 11B:
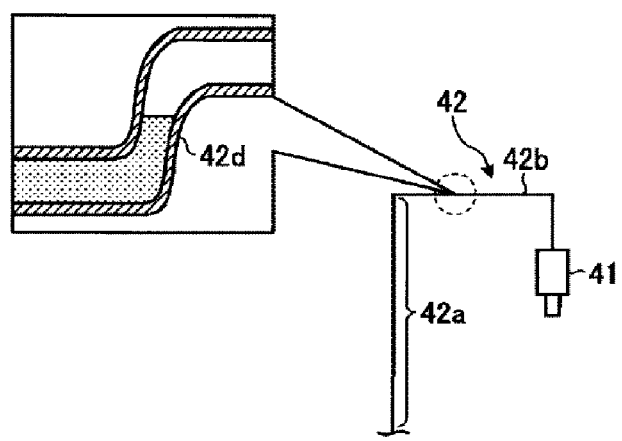
FIG. 11B is a diagram illustrating an exemplary modification of a solution surface position after a suck back process.

In FIG. 10, there has been described a case example in which a suck back process is performed such that the solution surface of the processing solution is positioned in the ascending portion 42a extending along the vertical direction. However, the solution surface position after the suck back process is not limited to the position illustrated in FIG. 10. FIGS. 11A and 11B are diagrams illustrating exemplary modifications of the solution surface position after the suck back process.

For example, as illustrated in FIG. 11A, in the supply flow path 42, a horizontal portion 42b is provided at the downstream side of the ascending portion 42a, and a curved portion 42c is formed between the ascending portion 42a and the horizontal portion 42b.

The height position of the processing solution in the curved portion 42c may also change. Therefore, the controller 18 may perform the suck back process such that the solution surface of the processing solution is positioned in the curved portion 42c.

Furthermore, as illustrated in FIG. 11B, a slope portion 42d rising toward the downstream side may be formed in the horizontal portion 42b, and the suck back process may be performed such that the solution surface of the processing solution is positioned in the slope portion 42d.

By setting the solution surface position after the suck back process in the ascending portion (the curved portion 42c or the slope portion 42d) at the downstream side of the ascending portion 42a in this way, it is possible to shorten the length from the solution surface of the processing solution to the discharging hole of the nozzle 41. Thus, it is possible to shorten the time lag, for example, from the output of the open signal to the second opening/closing part 62 to the discharge of the processing solution from the nozzle 41. In addition, it is possible to suppress the atmosphere of the processing solution from entering into the supply flow path 42 from the discharging hole of the nozzle 41.

Third Embodiment

An erroneous detection of a leak may occur in monitoring the presence or absence of an abnormal operation of the first opening/closing part 61 or the second opening/closing part 62 using the FFT described in the first embodiment. This will be described with reference to FIGS. 12A and 12B.

Figure 12A:
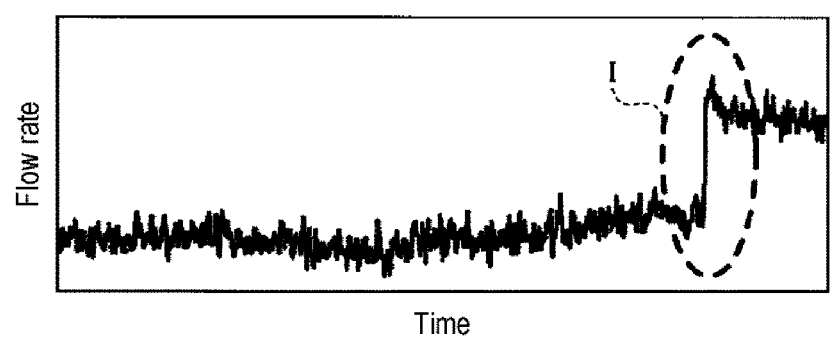
FIG. 12A is a diagram illustrating temporal changes in flow rate when a leak actually occurs.

FIG. 12A is a diagram illustrating a change with time of a flow rate when a leak actually occurs. As illustrated in FIG. 12A, it can be seen that when a leak actually occurs, a sudden change in flow rate occurs (see part I in FIG. 12A).

Figure 12B:
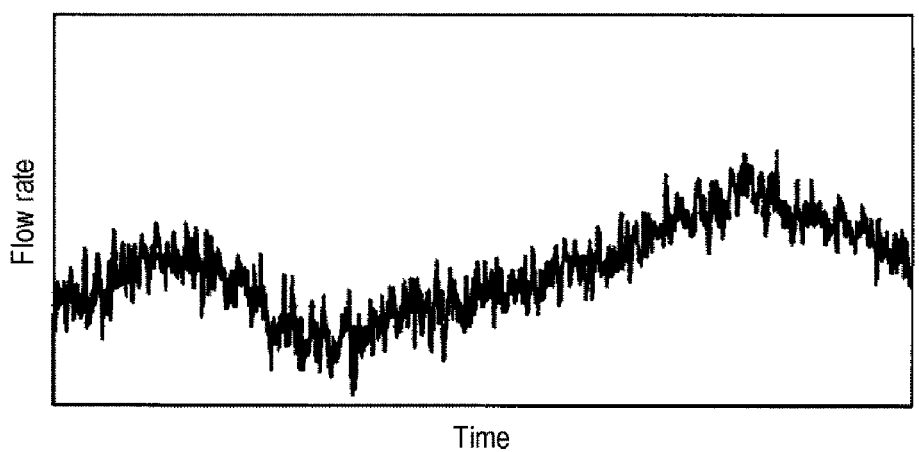
FIG. 12B is a diagram illustrating temporal changes in flow rate when an erroneous detection of a leak occurs.

On the other hand, FIG. 12B is a diagram illustrating a temporal change in the flow rate when an erroneous detection of a leak occurs. As illustrated in FIG. 12B, when a leak does not occur, a sudden flow rate change does not occur. However, when this data is subjected to FFT, there may be a case where a distribution in which a peak appears in a low frequency region is obtained as illustrated in the lower diagram of FIG. 7B. In this case, if the amplitude exceeds the threshold value at step S203, there is a possibility that a leak will be erroneously detected.

Therefore, in a third embodiment of the present disclosure, in order to prevent such erroneous detection of a leak, the following determining process is performed.

Figure 13:
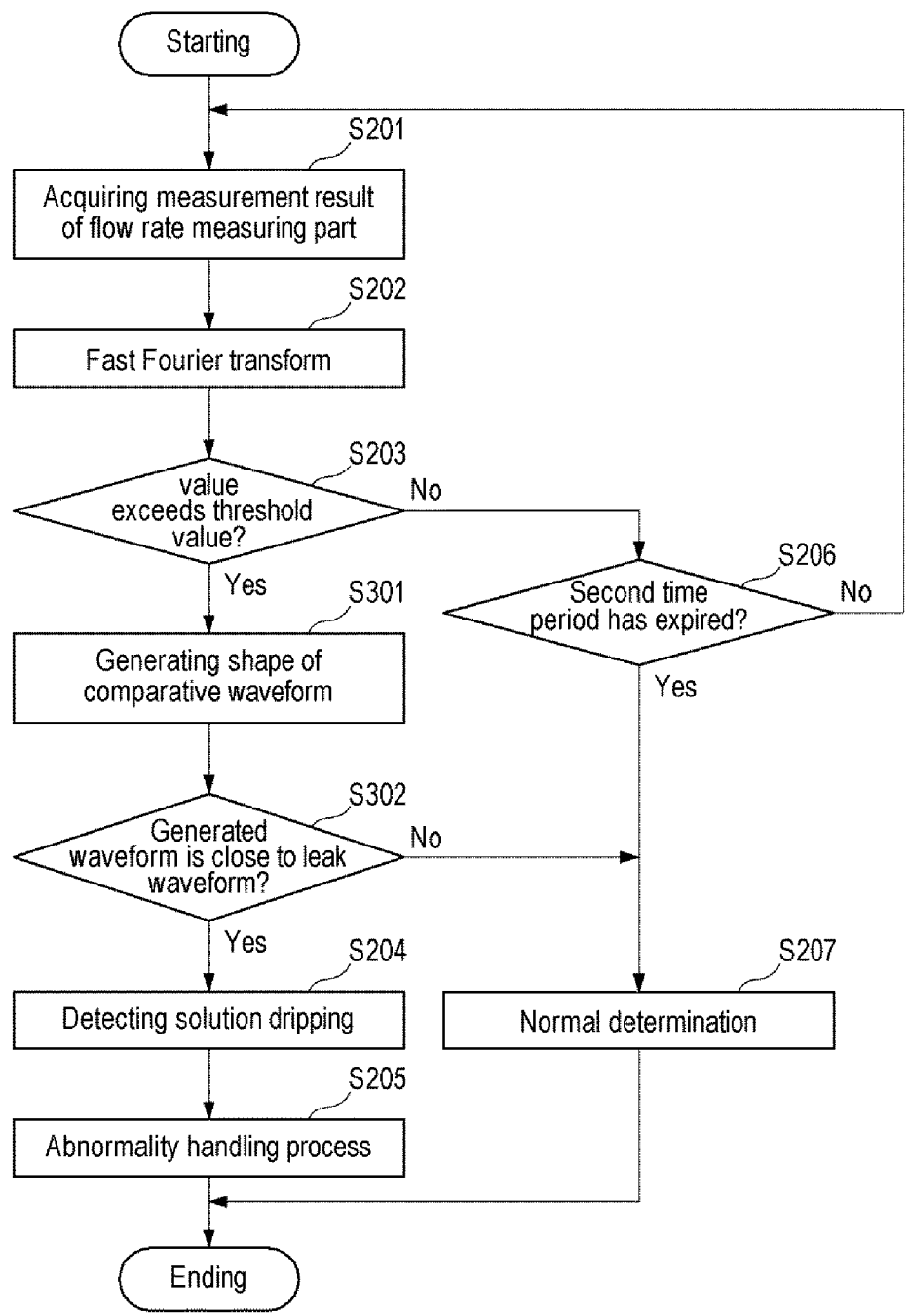
FIG. 13 is a flowchart illustrating a procedure of a second monitoring process in a third embodiment of the present disclosure.

FIG. 13 is a flowchart illustrating a procedure of a second monitoring process in a third embodiment of the present disclosure. Further, since the processing of steps S201 to S207 illustrated in FIG. 13 is similar to the processing of steps S201 to S207 illustrated in FIG. 9, a description thereof will be omitted.

In the third embodiment, when it is determined at step S203 that the value after the FFT exceeds a predetermined threshold value ("Yes" at step S203), a process of generating the shape of a comparative waveform is performed (step S301).

Specifically, an averaging process is performed on the measurement results before the execution of FFT (for example, the data illustrated in the upper diagrams of FIGS. 7A and 7B). For example, with respect to one time value for sampling, an average value of twelve points before and after it (a total of 25 points) is taken as an average value at that time. Graphs after such computation are illustrated in the upper diagrams of FIG. 14A and FIG. 14B. FIG. 14A is a graph after the averaging process is performed on the data in FIG. 12A, and FIG. 14B is a graph after the averaging process is performed on the data in FIG. 12B.

Further, in the upper diagrams of FIGS. 14A and 14B, even scale conversion is performed on the obtained average value. That is, it is assumed that the maximum value of the average values is set to 1,000 and the minimum value of the average values is set to −1,000, and such conversion is performed such that all average values become values between the maximum value and the minimum value.

Next, a process of comparing the generated shape and the leak waveform is performed (step S302).

The leak waveform is a waveform of a pattern representing the ideal leak measurement result stored in advance, has the minimum value of −1,000 and the maximum value of 1,000 as illustrated in the lower diagrams of FIGS. 14A and 14B and instantaneously changes from −1,000 to 1,000. This changing time (sampling number) may be experimentally obtained using an actual device.

Figure 15A:
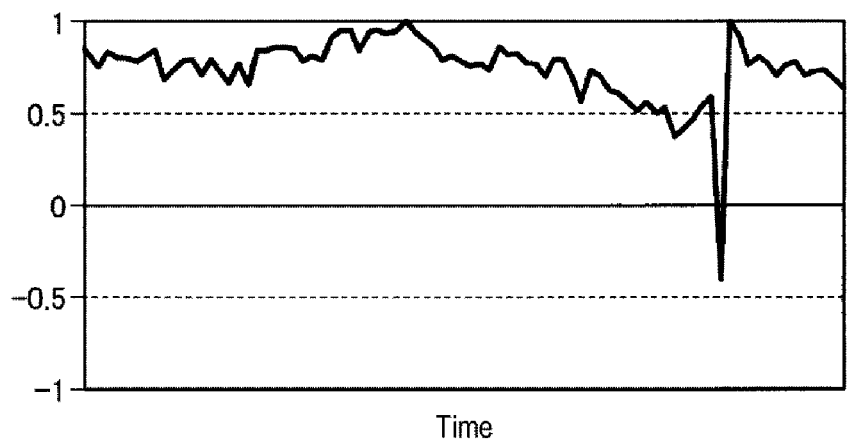
FIG. 15A is a diagram illustrating a result of accumulating a comparative waveform and a leak waveform when a leak actually occurs.
Figure 15B:
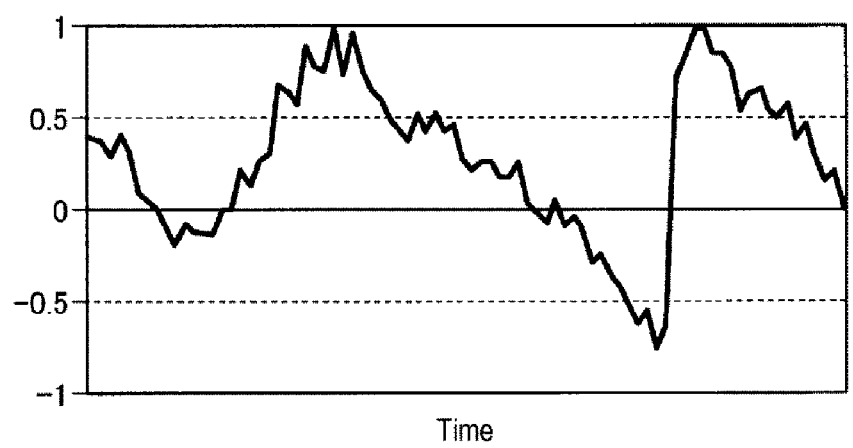
FIG. 15B is a diagram illustrating a result of accumulating a comparative waveform and a leak waveform when an erroneous detection of a leak occurs.

In the third embodiment, as illustrated in the lower diagrams of FIGS. 14A and 14B, the time of the change point of this waveform is matched to a timing when the generated shape exceeds the value of 500, and an accumulated value of the generated shape and the leak waveform is taken for all the sections. As illustrated in FIG. 15A, it can be seen that, in the waveform when a leak actually occurs, most of the accumulated value takes a value between 0.5 and 1.0 over the entire section, indicating that the degree of coincidence with the leak waveform is high. On the other hand, as illustrated in FIG. 15B, it can be seen that, in the waveform when a leak does not occur, namely in the waveform with which, when only FFT is performed, an erroneous detection may occur, the accumulated value largely fluctuates over the entire section, indicating that and the degree of coincidence with the leak waveform is low.

In the third embodiment, an average value of the accumulated values in all the sections is calculated, and when the calculated average value is greater than a threshold value (for example, 0.5), it is determined to have a shape close to the leak waveform ("Yes" at step S302) and solution dripping is detected (step S204). On the other hand, when the calculated average value is smaller than the threshold value, it is determined not to have a shape close to the leak waveform ("No" at step S302) and a normal determination that there is no abnormality in the processing fluid supply part 40 is made (step S207).

As described above, in the third embodiment, it is configured such that solution dripping of the first opening/closing part 61 or the second opening/closing part 62 is detected based on both the comparison result obtained by comparing the waveform of the measured flow rate before the FFT with the predetermined leak waveform, and the value after FFT, in addition to the determination using the FFT process. By performing the detection process by both the FFT and the waveform comparison in this way, there is an effect that highly reliable abnormality detection with little erroneous detection is possible.

Fourth Embodiment

Figure 16:
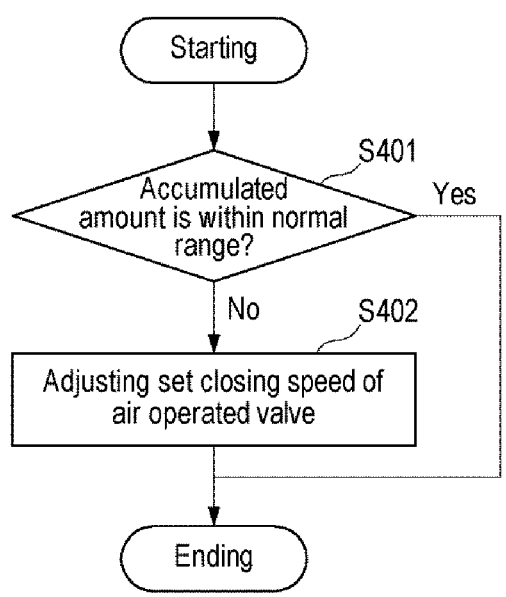
FIG. 16 is a flowchart illustrating a procedure of an automatic adjustment process according to a fourth embodiment of the present disclosure.

FIG. 16 is a flowchart illustrating a procedure of an automatic adjustment process according to a fourth embodiment of the present disclosure. As illustrated in FIG. 16, the controller 18 determines whether or not an accumulated amount during the first time period T1 (see FIG. 6) is within a normal range (step S401). Then, when the accumulated amount is out of the normal range ("No" at step S401), the controller 18 may control the speed controller 62c to adjust the set closing speed of the air operated valve 62a such that the accumulated amount during the next first time period T1 is within the normal range (step S402). When the accumulated amount is within the normal range ("Yes" at step S401), the controller 18 completes the automatic adjustment process without adjusting the set closing speed.

The speed controller 62c has, for example, a needle valve that adjusts the flow rate of air supplied to the air operated valve 62a by changing the flow path cross-sectional area of the air supply pipe 62b, and a driving part that drives the needle valve. The amount of protrusion of the needle valve is set in advance such that the closing speed of the air operated valve 62a becomes a predetermined set closing speed. When the accumulated amount is out of the normal range, the controller 18 controls the driving part to change the amount of protrusion of the needle valve, thereby changing the set closing speed.

Specifically, the storage part 19 (see FIG. 1) stores adjustment information in which the amount of deviation from the reference value of the accumulated amount and the adjustment amount of the speed controller 62c are associated with each other. Here, the amount of deviation from the reference value of the accumulated amount indicates a difference between the median value of the normal range (a value obtained by dividing the sum of the upper limit value and the lower limit value by 2, as an example of the reference value) and the accumulated value. For example, when the upper limit value of the normal range is 20 mL and the lower limit value thereof is 10 mL, the median value is 15 mL. In this case, when the accumulated amount is 25 mL, the amount of deviation of the accumulated amount is +10 mL. Furthermore, when the accumulated amount is 5 mL, the amount of deviation of the accumulated amount is −10 mL.

In addition, the adjustment amount of the speed controller 62c is, for example, a driving amount of the needle valve necessary for matching the accumulated amount with the median value of the normal range. For example, the adjustment information associates the amount of deviation "+10 mL" of the accumulated amount with the driving amount "+1 rotation" of the needle valve, and associates the amount of deviation "−10 mL" of the accumulated amount with the driving amount "−1 rotation" of the needle valve. Furthermore, "+" of the amount of deviation indicates that the accumulated amount is greater than the median value, and "−" of the amount of deviation indicates that the accumulated amount is smaller than the median value. In addition, "+" and "−" of the driving amount of the needle valve indicates the rotational direction of the needle valve.

At step S402, the controller 18 first calculates the amount of deviation of the accumulated amount. Subsequently, the controller 18 determines the adjustment amount of the speed controller 62c corresponding to the calculated amount of deviation, namely the driving amount of the needle valve, by referring to the adjustment information stored in the storage part 19. Then, the controller 18 causes the needle valve of the speed controller 62c to rotate by the determined number of revolutions to change the amount of protrusion of the needle valve. Thus, the flow path cross-sectional area of the air supply pipe 62b changes, and accordingly the supply speed (flow velocity) of air with respect to the air operated valve 62a changes. As a result, the closing speed of the air operated valve 62a is changed. That is, the set closing speed is changed.

For example, when the amount of deviation of the accumulated amount is "+10 mL", the controller 18 causes the needle valve to make one rotation in a direction which allows the flow path cross-sectional area of the air supply pipe 62b to decrease, thereby preventing solution dripping. Furthermore, when the amount of deviation of the accumulated amount is "−10 mL", the controller 18 causes the needle valve to make one rotation in a direction which allows the flow path cross-sectional area of the air supply pipe 62b to increase, thereby preventing solution interruption.

In this manner, when the accumulated amount of the flow rate measured by the flow rate measuring part 81 after outputting the close signal to the second opening/closing part 62 is out of the normal range, the controller 18 may control the speed controller 62c to change the set closing speed. Specifically, the controller 18 may control the driving part based on the adjustment information to drive the needle valve with the driving amount corresponding to the amount of deviation from the reference value, thereby changing the set closing speed. Thus, the closing speed of the air operated valve 62a can be adjusted to a moderate closing speed, which does not cause solution dripping and solution interruption without, for example, an operator's manual adjustment.

In this case, it is assumed that the amount of deviation of the accumulated amount is an amount of deviation when the median value of the normal range is used as a reference value, but the reference value may be any value within the normal range, and does not necessarily need to be the median value.

Furthermore, the controller 18 does not necessarily need to use the aforementioned adjustment information in the automatic adjustment process. For example, when the accumulated amount is out of the normal range, the controller 18 may adjust the speed controller 62c with a predetermined fixed adjustment amount, regardless of the amount of deviation of the accumulated amount. In this case, if the accumulated amount during the next first time period T1 is also out of the normal range, the controller 18 again adjusts the speed controller 62c with a predetermined fixed adjustment amount. By repeating this process, the accumulated amount can be kept within the normal range.

Fifth Embodiment

Figure 17:
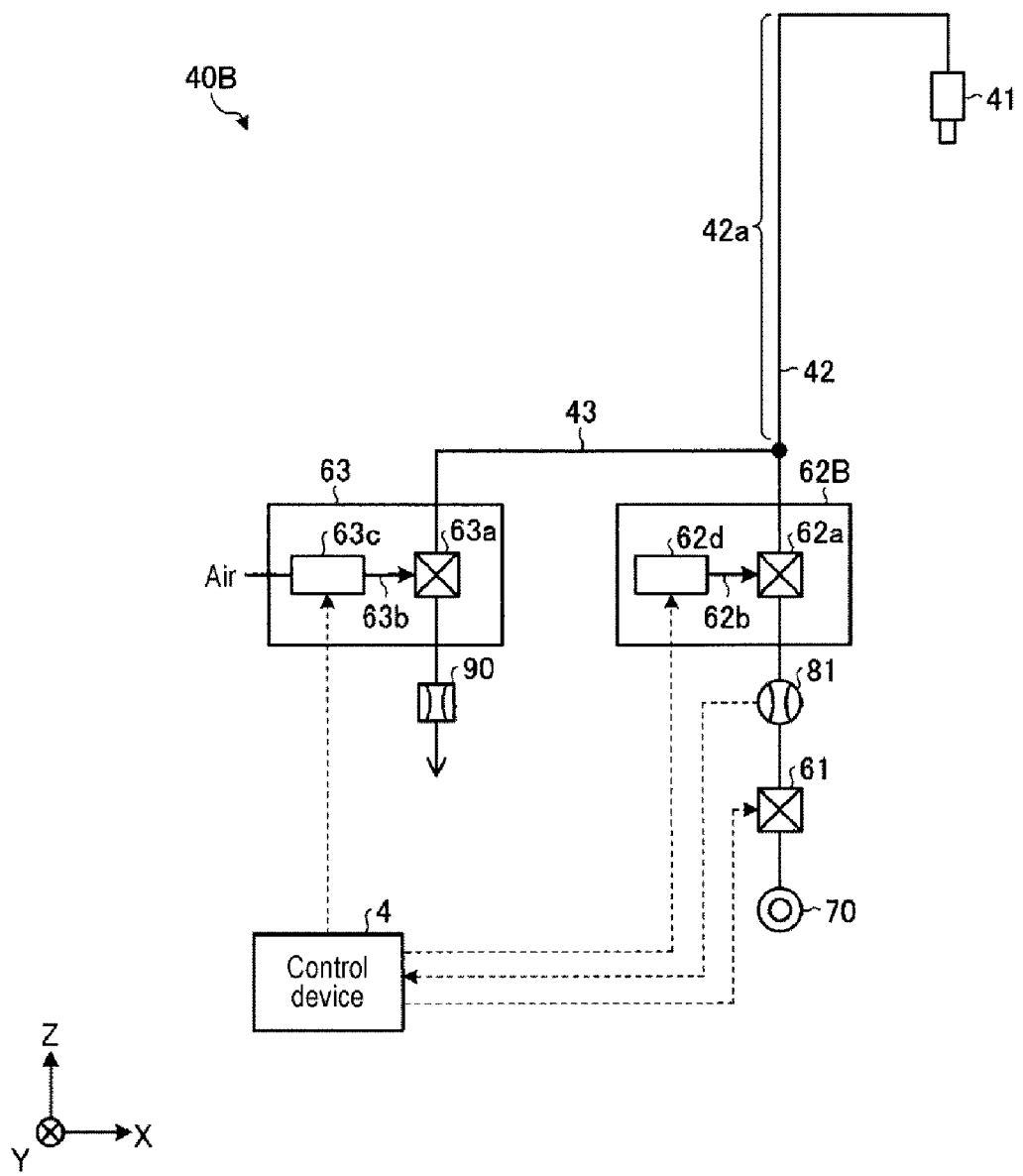
FIG. 17 is a diagram illustrating an example of a configuration of a processing fluid supply part according to a fifth embodiment of the present disclosure.

In the fourth embodiment described above, there has been described a case where the speed controller 62c is used as an example of the adjusting part for adjusting the closing speed of the air operated valve 62a to the predetermined set closing speed, but the adjusting part is not limited to the speed controller 62c. For example, the adjustment part may be an electro-pneumatic regulator. Hereinafter, a case example in which the adjustment part is an electro-pneumatic regulator will be described with reference to FIG. 17. FIG. 17 is a diagram illustrating an example of a configuration of a processing fluid supply part according to a fifth embodiment of the present disclosure.

As illustrated in FIG. 17, a processing fluid supply part 40B according to the fifth embodiment includes a second opening/closing part 62B. The second opening/closing part 62B includes an air operated valve 62a, an air supply pipe 62b, and an electro-pneumatic regulator 62d.

The electro-pneumatic regulator 62d is installed in the air supply pipe 62b. The electro-pneumatic regulator 62d is a device which adjusts the pressure of air by an electric signal, and adjusts the pressure of air supplied to the air operated valve 62a depending on the electric signal input from the controller 18. The controller 18 controls the electro-pneumatic regulator 62d to adjust the supply pressure to the air operated valve 62a such that the closing speed of the air operated valve 62a becomes a predetermined set closing speed.

When the accumulated amount of the flow rate measured by the flow rate measuring part 81 after outputting the close signal to the second opening/closing part 62B is out of the normal range, the controller 18 controls the electro-pneumatic regulator 62d to adjust the supply pressure to the electro-pneumatic regulator 62d. Thus, the set closing speed of the air operated valve 62a is changed.

For example, the storage part 19 stores adjustment information in which the amount of deviation of the accumulated amount and the amount of change in decompression speed are associated with each other. When it is determined at step S401 that the accumulated amount is out of the normal range ("No" at step S401), at step S402, the controller 18 first calculates the amount of deviation of the accumulated amount. Subsequently, the controller 18 determines the adjustment amount of the electro-pneumatic regulator 62d corresponding to the calculated amount of deviation, namely the change amount of the supply pressure, by referring to the adjustment information stored in the storage part 19. Then, the controller 18 controls the electro-pneumatic regulator 62d such that the pressure of air supplied from the electro-pneumatic regulator 62d to the air operated valve 62a decreases to a speed changed from the original supply pressure by the determined change amount.

In this manner, when the adjustment part is the electro-pneumatic regulator 62d, the controller 18 controls the electro-pneumatic regulator 62d to change the supply pressure to the air operated valve 62a, thereby changing the set closing speed of the air operated valve 62a.

In the aforementioned embodiments, there has been described an example in which the substrate to be processed is the wafer W. However, the aforementioned embodiments may be applied to the general processing apparatus that processes the substrate to be processed by supplying a processing fluid to the substrate to be processed.

According to the present disclosure in some embodiments, it is possible to detect an abnormality in a flow path opening/closing part.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing apparatus, comprising:
    a chamber configured to accommodate a substrate to be processed;
    a nozzle provided in the chamber and configured to supply a processing solution to the substrate;
    a flow rate measuring device in a flow path of the processing solution supplied to the nozzle;
    a flow path opener configured to open and close a supply flow path of the processing solution to the nozzle; and
    a controller configured to output a close signal causing the flow path opener to perform a closing operation that closes the supply flow path,
    wherein the flow path opener comprises a first opener, and a second opener provided at a downstream side of the first opener, the second opener configured to be opened after the first opener and to be closed before the first opener, and
    wherein the controller is configured to detect an operation abnormality of the second opener based on an accumulated measurement result of the flow rate measured by the flow rate measuring device after outputting the close signal to the second opener;
    wherein the second opener comprises an air operated valve in which a valve body is opened and closed by an air pressure, and a speed controller configured to adjust a flow rate of air supplied to the air operated valve, and
    wherein the controller is configured to detect an operation abnormality of the speed controller when the accumulated measurement result of the flow rate measured by the flow rate measuring device after outputting the close signal to the second opener is out of a normal range.

2. The apparatus of claim 1, wherein the controller is configured to detect an operation abnormality of the first opener or the second opener based on a value obtained by Fourier-transforming the flow rate measured by the flow rate measuring device after outputting the close signal to the second opener.

3. The apparatus of claim 2, wherein the controller is configured to detect an operation abnormality of the second opener when the value obtained by Fourier-transforming the flow rate measured by the flow rate measuring device exceeds a threshold value before outputting the close signal to the first opener after outputting the close signal to the second opener, and to detect an operation abnormality of the first opener when the value obtained by Fourier-transforming the flow rate measured by the flow rate measuring device exceeds the threshold value before outputting an open signal to the first opener after outputting the close signal to the first opener.

4. The apparatus of claim 3, wherein the controller is configured to monitor the presence or absence of the operation abnormality of the second opener based on the accumulated measurement result of the flow rate during a first time period from a time when the close signal is output to the second opener, and to monitor the presence or absence of the operation abnormality of the first opener or the second opener based on the value obtained by Fourier-transforming the flow rate in a second time period after the first time period.

5. The apparatus of claim 4, wherein the second time period is a time period after the first time period and a predetermined time period lapses.

6. The apparatus of claim 2, wherein the controller is configured to detect the operation abnormality of the first opener or the second opener based on both the value after the Fourier transform and a waveform comparison result obtained by comparing a waveform of the flow rate measured by the flow rate measuring device before the Fourier transform with a flow rate waveform obtainable when a predetermined operation abnormality occurs.

7. The apparatus of claim 1, further comprising:
    a pressure measuring device installed in an ascending portion in which the processing solution rises up in the supply flow path at the downstream side of the flow path opener and configured to measure a head pressure of the processing solution,
    wherein the controller is configured to detect the operation abnormality of the flow path opener based on a change amount of the head pressure measured by the pressure measuring device after outputting the close signal.

8. The apparatus of claim 1, wherein the second opener comprises: and an adjustment device configured to adjust a closing speed of the air operated valve to a predetermined set closing speed, and wherein the controller is configured to control the adjustment device to change the set closing speed when the accumulated measurement result of the flow rate measured by the flow rate measuring device after outputting the close signal to the second opener is out of a normal range.

9. The apparatus of claim 8, wherein the adjustment device comprises:

a needle valve configured to adjust a flow rate of air supplied to the air operated valve; and a driver configured to drive the needle valve, wherein the apparatus further comprises a storage part configured to store adjustment information in which an amount of deviation from a reference value within the normal range of the accumulated measurement result and a driving amount of the needle valve are associated with each other, and wherein the controller is configured to control the driver based on the adjustment information to drive the needle valve by a driving amount corresponding to the amount of deviation so as to change the set closing speed.

* * * * *